(12) United States Patent
Shimura et al.

(10) Patent No.: US 6,483,625 B2
(45) Date of Patent: Nov. 19, 2002

(54) WDM OPTICAL TRANSMISSION APPARATUS

(75) Inventors: Yoshitaka Shimura, Sapporo (JP); Motoyoshi Sekiya, Kawasaki (JP); Tetsuya Kiyonaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/998,694

(22) Filed: Dec. 3, 2001

(65) Prior Publication Data

US 2002/0037020 A1 Mar. 28, 2002

Related U.S. Application Data

(63) Continuation of application No. PCT/JP99/03562, filed on Jul. 1, 1999.

(51) Int. Cl.[7] .............................. H04B 10/04; H04J 14/02
(52) U.S. Cl. .................. 359/187; 359/132; 372/20; 372/32; 372/33; 372/34; 372/38.02
(58) Field of Search ................................ 359/187, 132; 372/20, 32, 33, 34, 38.02

(56) References Cited

U.S. PATENT DOCUMENTS

| | | | | |
|---|---|---|---|---|
| 5,978,395 A | * | 11/1999 | Nomura | 372/29.015 |
| 6,104,516 A | * | 8/2000 | Majima | 359/181 |
| 6,229,832 B1 | * | 5/2001 | Baba et al. | 372/29.011 |
| 6,359,918 B1 | * | 3/2002 | Bielas | 372/32 |

FOREIGN PATENT DOCUMENTS

| | | |
|---|---|---|
| JP | 57-115041 | 7/1982 |
| JP | 09-093224 | 4/1997 |
| JP | 09-298511 | 11/1997 |
| JP | 11-121853 | 4/1999 |
| JP | 11-126940 | 5/1999 |

\* cited by examiner

*Primary Examiner*—Leslie Pascal
*Assistant Examiner*—Shi K. Li
(74) *Attorney, Agent, or Firm*—Staas & Halsey LLP

(57) ABSTRACT

A WDM optical transmission apparatus of the present invention comprises: a light source (1) for generating light whose wavelength is changed according to the temperature and a drive current; a temperature control section (4) for controlling the temperature of the light source so that a wavelength at the starting of emission of the light source is stabilized in an allowable range of optical output wavelength set in advance; a drive current control section (5) for controlling the drive current applied to the light source according to the allowable range of the optical output wavelength; a wavelength control section (3) for detecting a wavelength of light output from the light source and controlling the temperature of the light source based on the detection result, to lead the optical output wavelength into the vicinity of a predetermined target wavelength; and an operation control section (6) for controlling the start and stop of the control operation of each section at predetermined timing respectively corresponding to the time of optical output generation and the time of optical output stop.

13 Claims, 19 Drawing Sheets

WDM OPTICAL TRANSMISSION APPARATUS

This application is a continuation of PCT/JP99/03562 filed on Jul. 1, 1999.

TECHNICAL FIELD

The present invention relates to an optical transmission apparatus used in a wavelength division multiplexed (WDM) optical transmission system. In particular, the invention relates to a WDM optical transmission apparatus in which there is performed a drive control that avoids an occurrence of inter-channel crosstalk caused by wavelength variations during transient states when an apparatus is started and stopped.

BACKGROUND ART

In a WDM optical transmission system, wavelengths of a plurality of optical signals to be wavelength multiplexed are standardized by the ITU (International Telecommunication Union). Most conventional optical transmission apparatuses used in WDM optical transmission systems are provided with a function that performs an automatic wavelength (frequency) control (hereunder abbreviated to AFC) in order to stabilize the wavelength of output light. This AFC function is a function that, for example, detects a wavelength of output light from a laser diode (LD), feeds back the detection result to control the temperature of the LD in order to maintain the wavelength of output light to be constant, which is realized by a so-called wavelength locker or the like.

FIG. 1 and FIG. 2 are block diagrams showing structural examples of conventional WDM optical transmission apparatus.

In the structural example of FIG. 1, light transmitted from an LD 100 is modulated by an external modulator 110, and its optical signal is output to the exterior via a wavelength locker 120 and an optical filter 150. In the wavelength locker 120, a wavelength of the optical signal from the external modulator 110 is detected by a wavelength detecting section 121 and the detection result is transmitted to a wavelength control circuit 122. In the wavelength control circuit 122, a signal for controlling the temperature of the LD 100 is generated such that the wavelength of the output light reaches a required target wavelength to be transmitted to a temperature control circuit (ATC) 130. In the temperature control circuit 130, the operating temperature of the LD 100 is controlled according to the signal from the wavelength control circuit 122, and a temperature monitor signal. Furthermore, a drive current to the LD 100 is controlled by a drive current control circuit 140. As a result, during normal operation, an optical signal is transmitted in a state where its channel interval is constant (for example 0.8 nm). Moreover, by installing an optical filter 150 such as a bandpass filter (BPF) on the output side of the wavelength locker 120, an occurrence of inter-channel crosstalk caused by wavelength variations at starting and during stopping of the apparatus is suppressed by hardware.

Furthermore, in the structural example of FIG. 2, the wavelength locker 120 monitors light emitted from the rear face of the LD 100 and performs a wavelength control. Also by installing an optical switch 160 on the output side of the external modulator 110, the occurrence of inter-channel crosstalk caused by wavelength variations is suppressed. Here, a modulator may be used as the optical switch 160.

In a conventional WDM optical transmission apparatus as described above, in order to avoid the occurrence of inter-channel crosstalk, an optical filter, an optical switch or the like is provided. However, since an optical filter, optical switch or the like needs to be provided for each wavelength light, the overall construction of the transmission apparatus becomes complicated, hence causing a problem in that it is difficult to achieve miniaturization and low cost. Furthermore, in a case where an optical filter is used, there is a disadvantage in that a large number of optical filters having different characteristics must be prepared. Moreover, there is also a problem in that by inserting optical filters, optical switches or the like, losses become large.

The present invention takes the above situation into consideration with the object of providing a WDM optical transmission apparatus capable of suppressing an occurrence of inter-channel crosstalk, by controlling the temperature of a light source and its drive current appropriately without optical filters, optical switches or the like.

DISCLOSURE OF THE INVENTION

In order to achieve the above object, a WDM optical transmission apparatus of the present invention used in a WDM optical transmission system for transmitting a wavelength division multiplexed signal light including a plurality of different optical signals, comprises: a light source for generating light whose wavelength is changed according to the temperature and a drive current; temperature control means for controlling the temperature of the light source so that a wavelength at the starting of emission of the light source is stabilized in an allowable range of optical output wavelength set in advance, based on wavelength characteristics for the light source drive current and intervals between adjacent optical signal wavelengths; drive current control means for controlling the drive current applied to the light source according to the allowable range of the optical output wavelength; wavelength control means for detecting a wavelength of light output from the light source and controlling the temperature of the light source based on the detection result, to lead the optical output wavelength into the vicinity of a preset target wavelength; and operation control means for controlling the start and stop of respective control operations of the temperature control means, the drive current control means and the wavelength control means at predetermined timing respectively corresponding to the time of optical output generation and the time of optical output stop.

According to such a construction, during transient states when the apparatus is started and stopped, variations occur in optical output wavelength due to changes of temperature and drive current of the light source. However, the temperature and drive current of the light source are controlled by the temperature control means, the drive current control means and the wavelength control means such that variations of this optical output wavelength are held within the allowable range set in advance. At this time, by controlling the start and suspension of the respective control operations of the temperature control means, the drive current control means and the wavelength control means, by the operation control means at the predetermined timing, it becomes possible to avoid an occurrence of inter-channel crosstalk without installing optical filters, optical switches or the like.

For a specific construction of the abovementioned WDM optical transmission apparatus, the arrangement is preferably such that the operation control means starts the control operation of the temperature control means when the optical output is generated, starts the control operation of the drive current control means when the temperature control is stabilized, starts the control operation of the wavelength control means when the drive current control is stabilized, and furthermore, the operation control means stops the control operation of the wavelength control means when the optical output is stopped, stops the control operation of the drive current control means when the temperature of the light source is stabilized by the control operation of the temperature control means, and stops the control operation of the temperature control means when there is no supply of drive current to the light source and emission is stopped.

Furthermore, the drive current control means may be constituted to perform an automatic current control for controlling the drive current supplied to the light source to be constant, or perform an automatic power control for controlling the drive current such that the optical output power from the light source is kept constant. Moreover, in a case where automatic power control is performed, by providing a circuit construction using a differential amplification method, maximum drive current is restricted, and hence it is possible to prevent an over current supply to the light source.

Furthermore, for a specific construction of the temperature control means, the arrangement may also be such that a reference temperature being a target of the control operation, is given according to a reference voltage set inside the apparatus, or is set according to a reference voltage applied from outside the apparatus.

Moreover, for an improvement to realize high output of the abovementioned WDM optical transmission apparatus, the arrangement may be such that the drive current control means is capable of setting in stepwise a reference value being a target of the control operation according to a plurality of reference voltages, and the operation control means starts the control operation of the temperature control means when the optical output is generated, starts the control operation of the drive current control means when the temperature control is stabilized, starts the control operation of the wavelength control means when the drive current control is stabilized, and when the wavelength control is stabilized, switches the reference voltage of the drive current control means to a higher level by one step each time, and continuously repeats the switching of the reference voltage each time the wavelength control is stabilized.

Alternatively, for another improvement to realize high output of the abovementioned WDM optical transmission apparatus, the arrangement may also be such that the operation control means starts the control operation of the temperature control means when the optical output is generated, starts the control operation of the drive current control means when the temperature control is stabilized, and thereafter, during a period until the drive current reaches a target reference value, repeats a series of operations in which, when the optical output wavelength detected by the wavelength control means reaches an upper limit wavelength set within the allowable range, the control operation of the wavelength control means is started and also the control operation of the drive current control means is suspended, and when the optical output wavelength is led into the vicinity of the target wavelength by the control operation of the wavelength control means, the control operation of the drive current control means is resumed.

According to the construction applied with such an improvement, it becomes possible to increase the drive current to the light source while realizing the control within the allowable range of the optical output wavelength, to achieve a high output of the present apparatus.

In addition, for a specific construction of the operation control means, the arrangement may be such that there is provided a timer for performing timing operations in synchronization with an alarm signal input for instructing the generation and stop of optical output, and outputting a signal for controlling the start and stop of the respective control operation of the temperature control means, the drive current control means and the wavelength control means according to predetermined timing set in advance.

According to such a construction, the start and stop of the respective control operations of the temperature control means, the drive current control means and the wavelength control means are controlled according to timing based on timing operations of the timer.

Alternatively, for another specific construction of the operation control means, the arrangement may be such that there is provided a temperature control alarm generation section for generating a temperature control alarm signal indicating the control state of the temperature control means, a drive current control alarm generation section for generating a drive current control alarm signal indicating the control state of the drive current control means, and a sequencing section for controlling the start and stop of the respective control operations of the temperature control means, the drive current control means and the wavelength control means based on external alarm signals for instructing the generation and stop of optical output, the temperature control alarm signal and the drive current control alarm signal.

According to such a construction, operation timing of each section is controlled according to actual control states based on the respective alarm signals generated inside the apparatus.

BEST MODE FOR CARRYING OUT THE INVENTION

As follows is a description of a WDM optical transmission apparatus according to the preset invention based on the appended drawings.

First is a brief description of the typical characteristics of a laser diode (LD) used as a light source in a WDM optical transmission apparatus.

Figure 3:
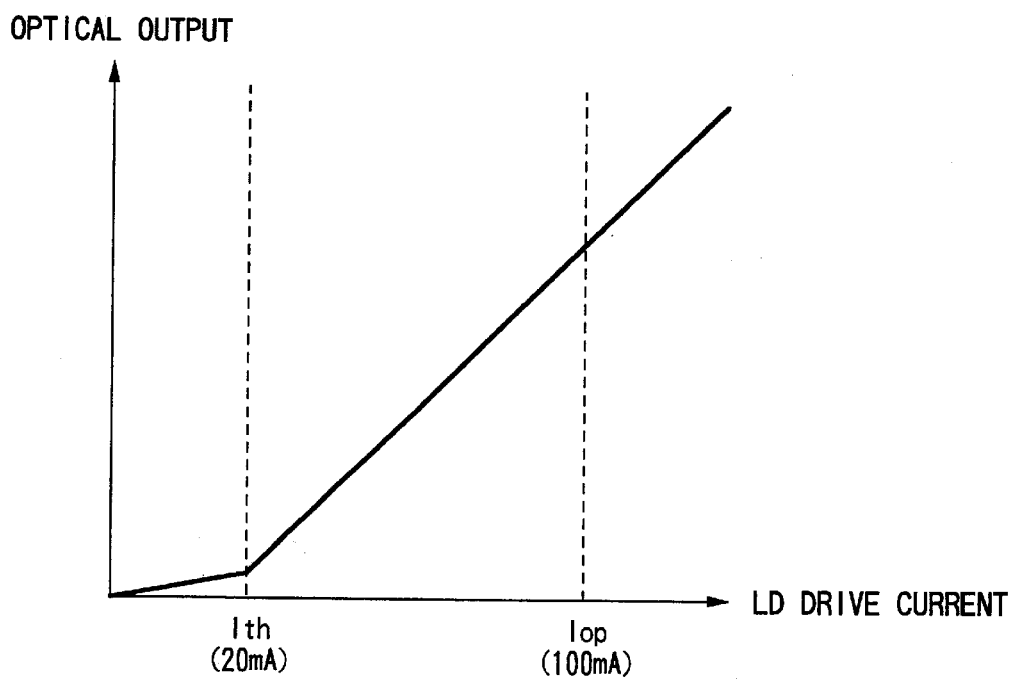
FIG. 3 is a graph showing the relationship between optical output power and drive current of a typical LD.
Figure 4:
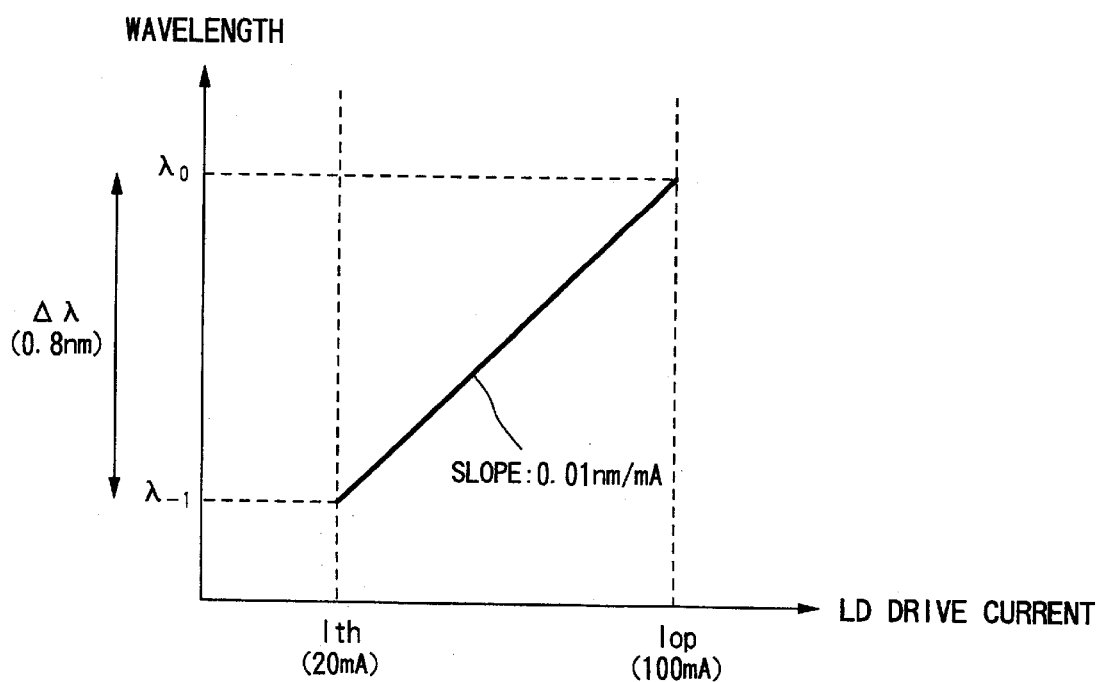
FIG. 4 is a graph showing the relationship between optical output wavelength and drive current of a typical LD.

FIG. 3 is a graph showing the relationship between optical output power and drive current of an LD. Furthermore, FIG. 4 is a graph showing the relationship between optical output wavelength and drive current of the LD.

As shown in FIG. 3, when the drive current exceeds a threshold current Ith (for example 20 mA or the like), the optical output power is increased rapidly, and the drive current reaches a drive current Iop (for example 100 mA or the like), and hence a required optical output power can be obtained. Furthermore, as shown in FIG. 4, an optical output wavelength of the LD has a characteristic such that it shifts in the long wavelength side with the increase of drive current. In the figure, a characteristic example is shown in which a ratio (slope) of change in the optical output wavelength to the drive current is 0.01 nm/mA.

Due to the fact that the optical output wavelength of the LD is varied with a change in the drive current as mentioned above, when the LD starts the emission, there is a possibility that an output light crosses the wavelengths of the adjacent channels (optical signals), causing an occurrence of inter-channel crosstalk during a period until the optical output wavelength is stabilized at a target wavelength. Furthermore, when the emission of the LD is stopped, there is another possibility an occurrence of inter-channel crosstalk during a period until the optical output is extinguished.

Therefore, in order that inter-channel crosstalk does not occur even when starting and stopping the emission of the LD, it is necessary to limit a wavelengths range within which LD emission is allowable.

Figure 5:
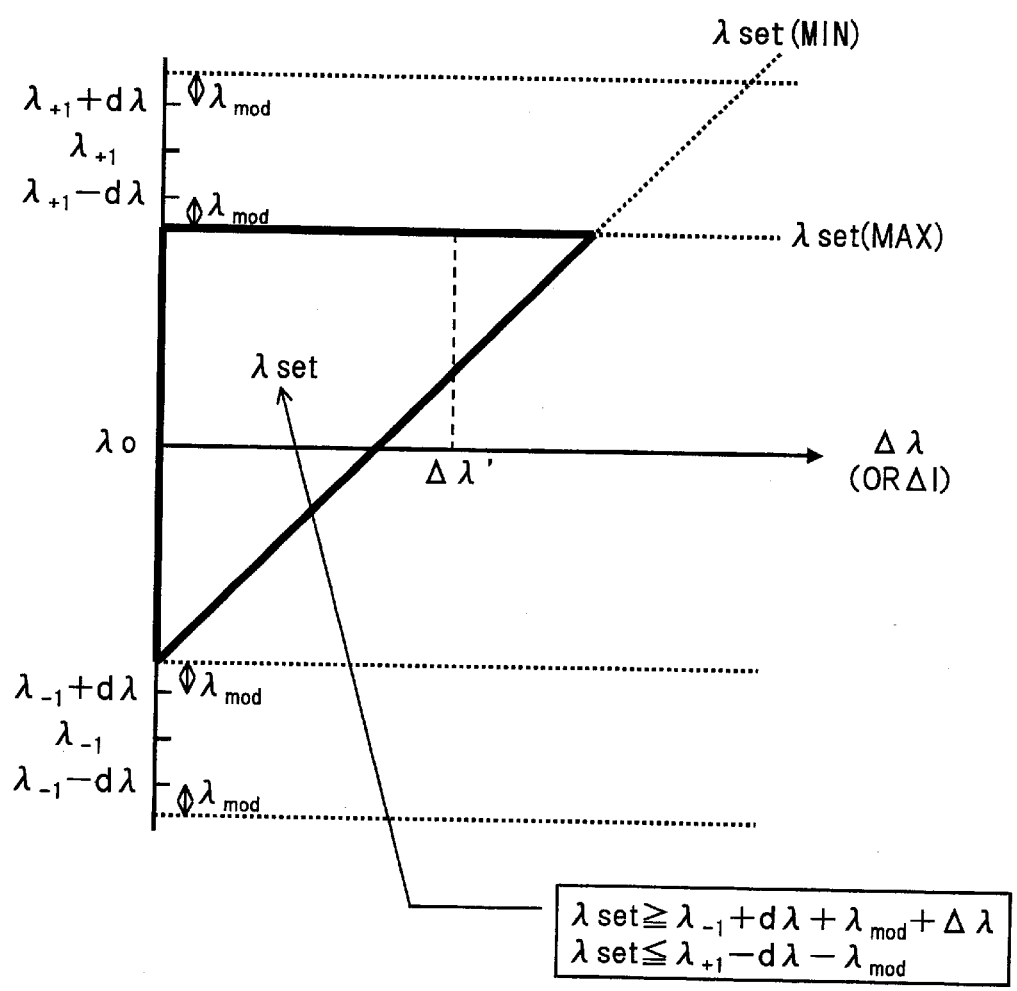
FIG. 5 is a graph showing an allowable range of optical output wavelengths of LD for avoiding an occurrence of inter-channel crosstalk.
Figure 6:
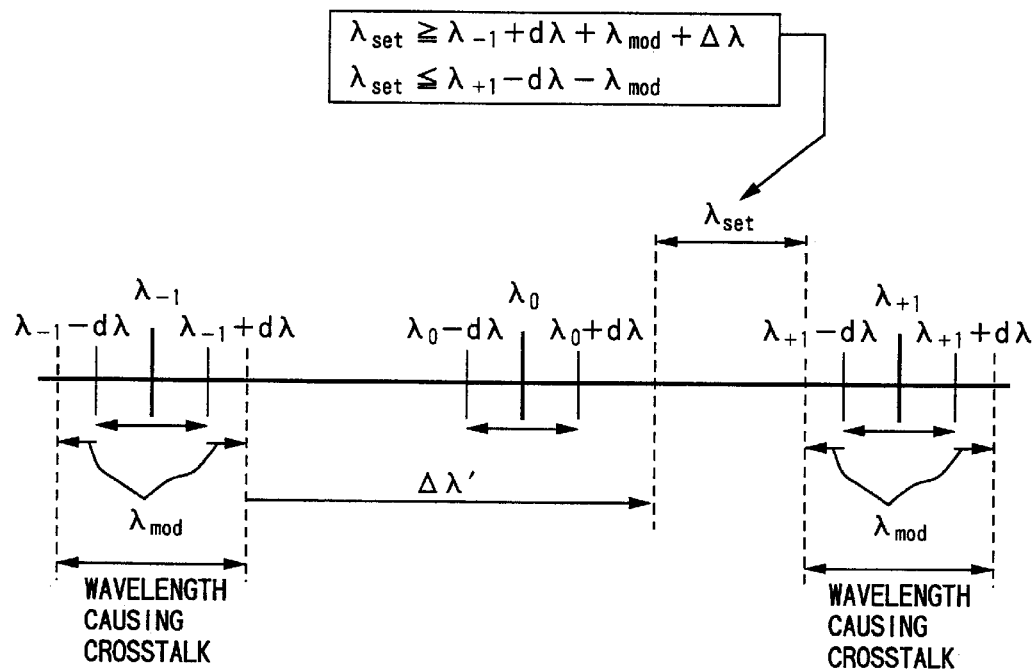
FIG. 6 is a graph showing a state where an amount of wavelength variation in FIG. 5 is Δλ' with wavelength on the axis of abscissas.

FIG. 5 and FIG. 6 are graphs each showing an allowable range of optical output wavelength of the LD in order to avoid the occurrence of inter-channel crosstalk.

In FIG. 5, the axis of ordinates designates wavelengths and the axis of abscissas designates a wavelength variation amount $\Delta\lambda$ of the optical output wavelength when the drive current of the LD is switched from OFF to ON. This wavelength variation amount $\Delta\lambda$ corresponds to a variation amount $\Delta I$ of the drive current. Furthermore, FIG. 6 shows a state of when the wavelength variation amount is $\Delta\lambda'$ in FIG. 5, with wavelength on the axis of abscissas.

Here, the target wavelength of the optical output is $\lambda_0$, the wavelength of an adjacent channel on the short wavelength side is $\lambda_{-1}$, and the wavelength of an adjacent channel on the long wavelength side is $\lambda_{+1}$. Furthermore, $d\lambda$ designates a setting error of wavelength, and $\lambda_{mod}$ designates a modulation bandwidth representing a wavelength variation amount caused by modulation of the output light, which is determined by the bit rate of transmission light.

A wavelength range within which inter-channel crosstalk does not occur for the target wavelength $\lambda_0$ of the optical output is a range between $\lambda_{-1}+d\lambda+\lambda_{mod}$ and $\lambda_{+1}-d\lambda-\lambda_{mod}$. Considering the wavelength shift characteristics of the LD, a wavelength range $\lambda_{set}$ within which the emission of the LD is allowable is an area bordered by thick lines in FIG. 5. This allowable range $\lambda_{set}$ of optical output wavelength can be expressed by the following equations (1) and (2).

$$\lambda_{set} \geq \lambda_{-1}+d\lambda+\lambda_{mod}+\Delta\lambda \quad (1)$$

$$\lambda_{set} \leq \lambda_{+1}-d\lambda-\lambda_{mod} \quad (2)$$

Accordingly, it becomes possible to avoid the occurrence of inter-channel crosstalk, by controlling an operation of the optical transmission apparatus such that the wavelength of when the LD starts the emission becomes $\lambda_{-1}+d\lambda+\lambda_{mod}$ or more, and also that the wavelength of when the drive current is stabilized (wavelength locker is not operating) at the drive current Iop, where the required optical output power can be obtained, is within the abovementioned allowable range $\lambda_{set}$.

In the aforementioned conventional optical transmission apparatus, since there is not provided a function for controlling the wavelength within the allowable range $\lambda_{set}$ as described above, an optical filter, an optical switch or the like is installed so as to not output to the exterior by hardware, the light of wavelengths $\lambda_{-1}+d\lambda+\lambda_{mod}$ or less, or $\lambda_{+1}-d\lambda-\lambda_{mod}$ or more. Contrary to this, the WDM optical transmission apparatus according to the present invention makes it possible to suppress the occurrence of inter-channel crosstalk without using an optical filter, an optical switch or the like, by controlling the temperature and drive current of LD appropriately.

As follows is a description of embodiments of the WDM optical transmission apparatus according to the present invention.

Figure 7:
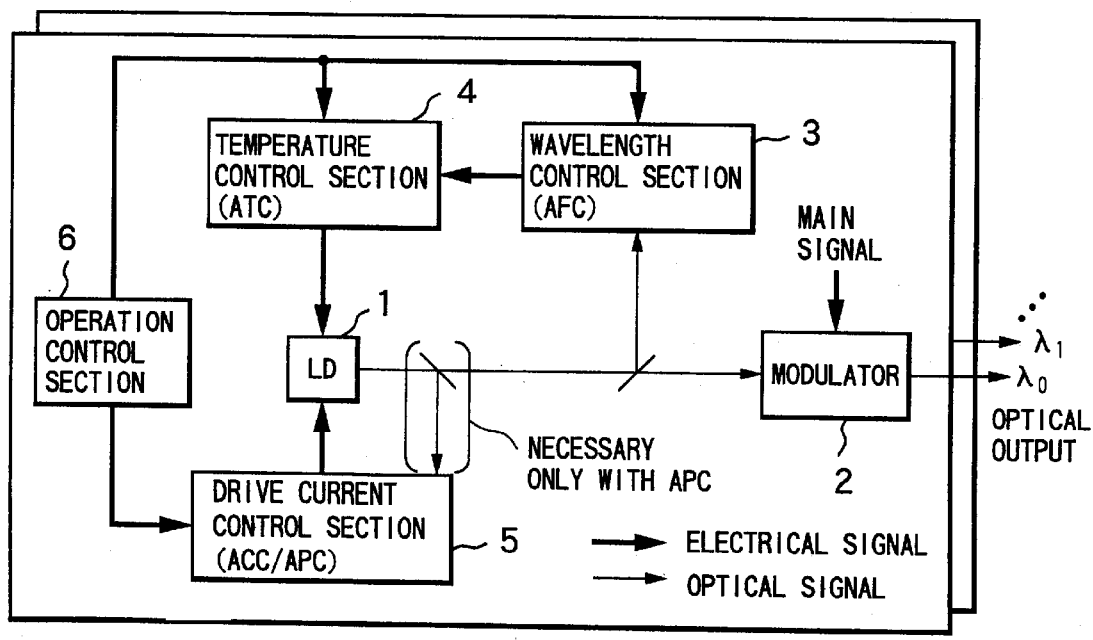
FIG. 7 is a block diagram showing a basic structure of a WDM optical transmission apparatus according to the present invention.

FIG. 7 is a block diagram showing a basic structure of the WDM optical transmission apparatus according to the present embodiment.

In FIG. 7, the present apparatus is provided with: an LD 1 serving as a light source; a modulation section 2 for modulating an output light of the LD 1; a wavelength control section (AFC) 3 serving as wavelength control means for branching the output light of the LD 1 to detect its wavelength and controlling the optical output wavelength to be constant at the target wavelength $\lambda_0$; a temperature control section (ATC) 4 serving as temperature control means for controlling the optical output wavelength by adjusting the temperature of the LD 1; a drive current control section (ACC/APC) 5 serving as drive current control means for controlling the drive current to the LD 1; and an operation control section 6 serving as operation control means for controlling respective operation timing of the wavelength control section 3, the temperature control section 4, and the drive current control section 5.

Figure 1:
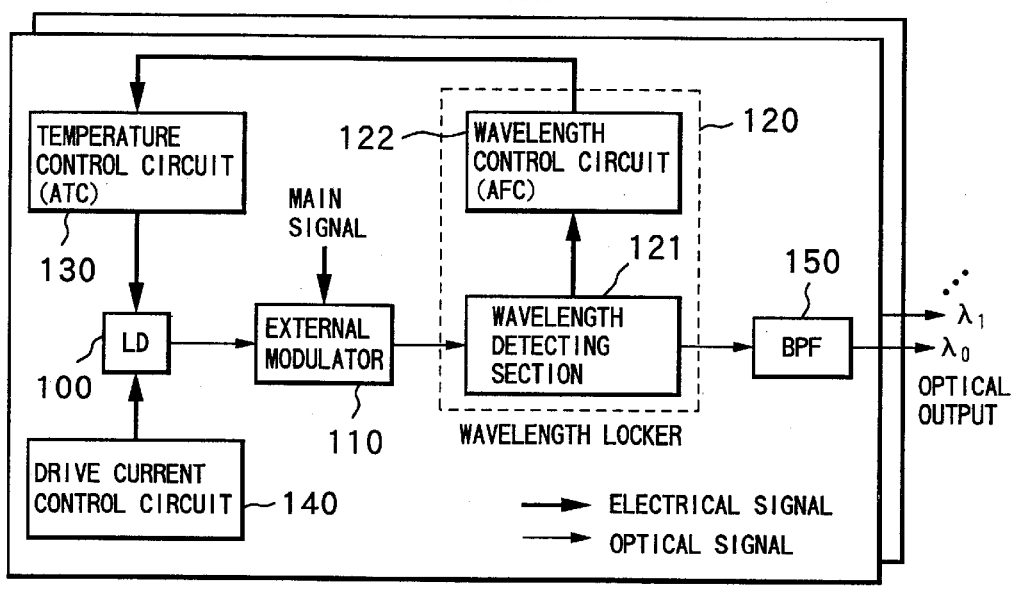
FIG. 1 is a block diagram showing a structural example of a conventional WDM optical transmission apparatus.
Figure 2:
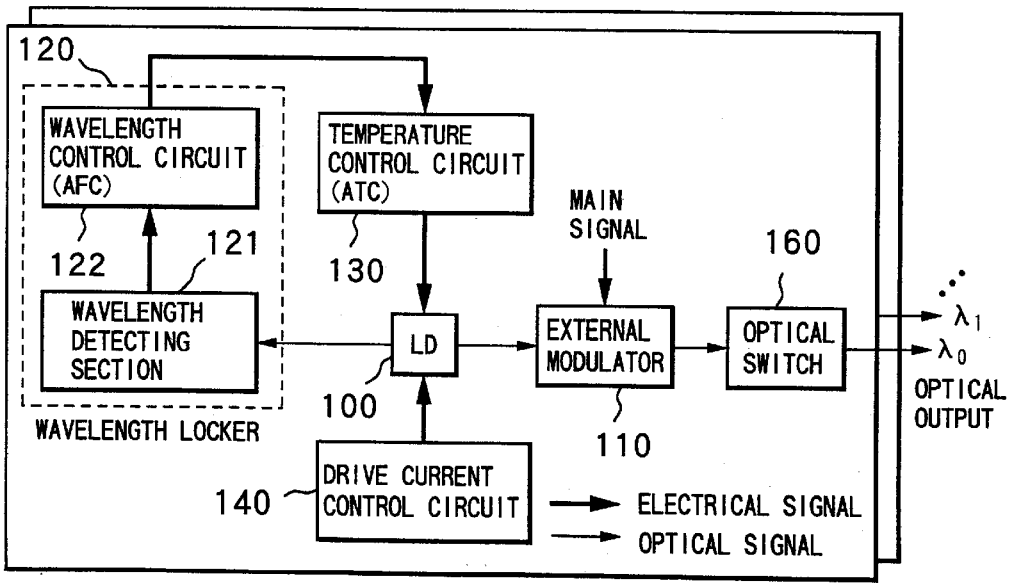
FIG. 2 is a block diagram showing another structural example of a conventional WDM optical transmission apparatus.

Here, the construction is such that a part of the light output from the front face of the LD 1 is branched and transmitted to the wavelength control section 3. However, similarly to the case shown in the abovementioned FIG. 2, the construction may also be such that the light output from the rear face of the LD 1 is transmitted to the wavelength control section 3. Furthermore, the modulation section 2 is provided inside the present apparatus. Alternatively, a modulator may be provided outside the present apparatus.

Figure 8:
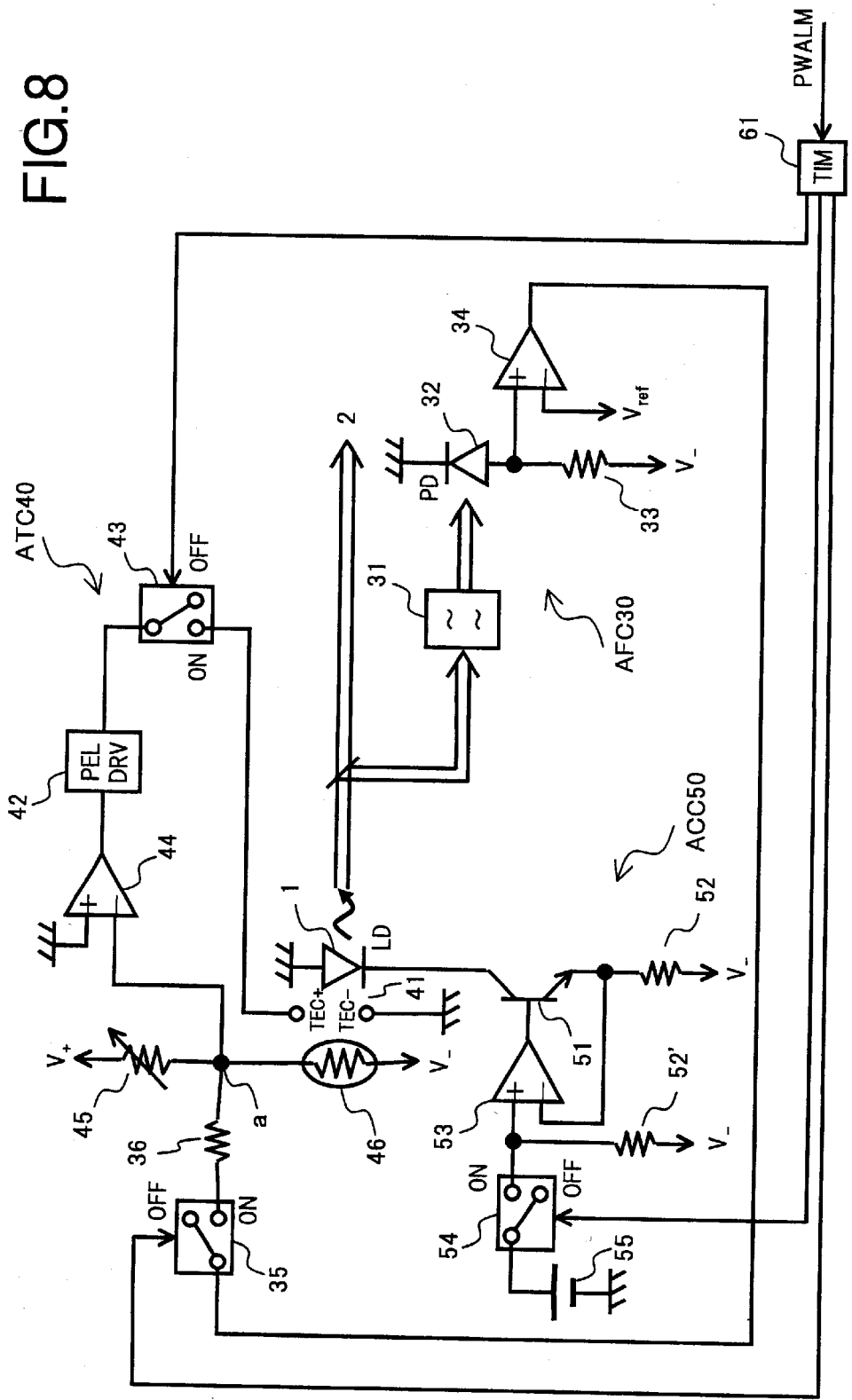
FIG. 8 is a diagram showing a structure of a WDM optical transmission apparatus of a first embodiment.

FIG. 8 shows a structure of a first embodiment as a specific example of the WDM optical transmission apparatus having the above-described basic structure.

In the structural example of FIG. 8, light output from the LD 1 is transmitted to the modulation section 2, and a part of the light is branched and transmitted to an AFC circuit 30 serving as the wavelength control section 3. This AFC circuit 30 is of a similar construction to a so-called wavelength locker, and has, for example, a wavelength detection filter 31, a photodiode (PD) 32, a resistor 33, an operational amplifier (op-amp) 34 and a switch 35. The wavelength detection filter 31 is an optical filter having a characteristic that its transmissivity differs according to wavelength, and is input with a part of the output light from the LD 1. The PD 32 photoelectrically converts the light transmitted through the wavelength detection filter 31 to generate current according to the received optical power. A value of this current differs depending on optical output wavelength. The resistor 33 converts the current generated by the PD 32 into a voltage. The op-amp 34 has a non-inverting input terminal connected to a contact point between the PD 32 and the resistor 33, and an inverting input terminal applied with a predetermined reference voltage $V_{ref}$, to output a signal corresponding to a difference between the voltage level at the contact point and the reference voltage $V_{ref}$ to an ATC circuit 40 serving as the temperature control section 4 via the switch 35. The switch 35 performs the ON/OFF operation according to a signal from a timer (TIM) 61 serving as the operation control section 6.

The ATC circuit 40 has a Peltier element 41, a Peltier drive section (PEL DRV) 42, a switch 43, an op-amp 44, a variable resistor 45 and a thermistor 46. The Peltier element 41 is a device for adjusting the temperature of the LD 1 by generating or absorbing heat depending on current supplied from the Peltier drive section 42 via the switch 43. The Peltier drive section 42 generates current corresponding to an output signal from the op-amp 44. The switch 43 performs the ON/OFF operation according to a signal from the timer 61. The op-amp 44, has an inverting input terminal connected to a common contact point "a" of the variable resistor 45 and the thermistor 46, which are connected in series between positive and negative power sources $V_+$ and $V_-$, and a non-inverting input terminal that is grounded, to output a signal corresponding to a voltage level at the contact point "a" to the Peltier drive section 42. The variable resistor 45 is a reference resistor for applying a reference value for temperature control of the LD 1 through the resistance value thereof. A resistance value of the thermistor 46 is changed depending on the temperature of the LD 1, and as a result, the voltage level at the contact point "a" is changed corresponding to the temperature of the LD 1. Here, the switch 35 of the AFC circuit 30 is connected to the contact point "a" in series with the resistor 36, and when the switch 35 is turned ON, the output voltage of the op-amp 34 is applied.

The drive current control section 5 is assumed to perform the automatic current control (ACC) for controlling the drive current to be constant, and an ACC circuit 50 that realizes this control has a transistor 51, resistors 52 and 52', an op-amp 53, a switch 54 and a reference power source 55. The transistor 51 has a collector terminal connected to the LD 1, an emitter terminal connected to the negative power source $V_-$ via the resistor 52, and a base terminal connected to an output terminal of the op-amp 53. Furthermore, the emitter terminal is also connected to an inverting input terminal of the op-amp 53. In the op-amp 53, a non-inverting input terminal is pulled down to the negative power source $V_-$ via the resistor 52', and the non-inverting input terminal is further connected to the reference power source 55 via the switch 54. When the switch 54 is turned ON, the op-amp 53 supplies the drive current to the LD 1, and controls the current value to be constant at Iop. Here, the current value Iop, being a reference for controlling the ACC, is set to a required value in advance by a reference voltage applied by the reference power source 55.

The timer 61 outputs control signals for turning the switches 35, 43 and 54 ON and OFF according to optical ON/OFF alarm signals (referred to hereunder as PWALM signals) applied from the exterior at predetermined timing to be described later.

Next is a description of an operation of the first embodiment.

Here, for operating conditions of the present optical transmission apparatus, for example, a case is assumed where the bit rate of transmission signal light is 10 Gb/s, a setting error dλ of wavelength of each channel light is 0.1 nm, the wavelength interval of each channel light is 0.8 nm, and the modulation bandwidth $\lambda_{mod}$ is 0.08 nm.

In the operating conditions as described above, the allowable range $\lambda_{set}$ of the optical output wavelength of the LD 1 to avoid the occurrence of inter-channel crosstalk can be represented by the following equations (1)' and (2)', wherein specific numerical values are assigned to the aforementioned equations (1) and (2).

$$\lambda_{set} \geq (\lambda_0 - 0.8) + 0.1 + 0.08 + \Delta\lambda = \lambda_0 - 0.62 + \Delta\lambda \quad (1)'$$

$$\lambda_{set} \leq (\lambda_0 + 0.8) - 0.1 - 0.08 = \lambda_0 + 0.62 \quad (2)'$$

Figure 9:
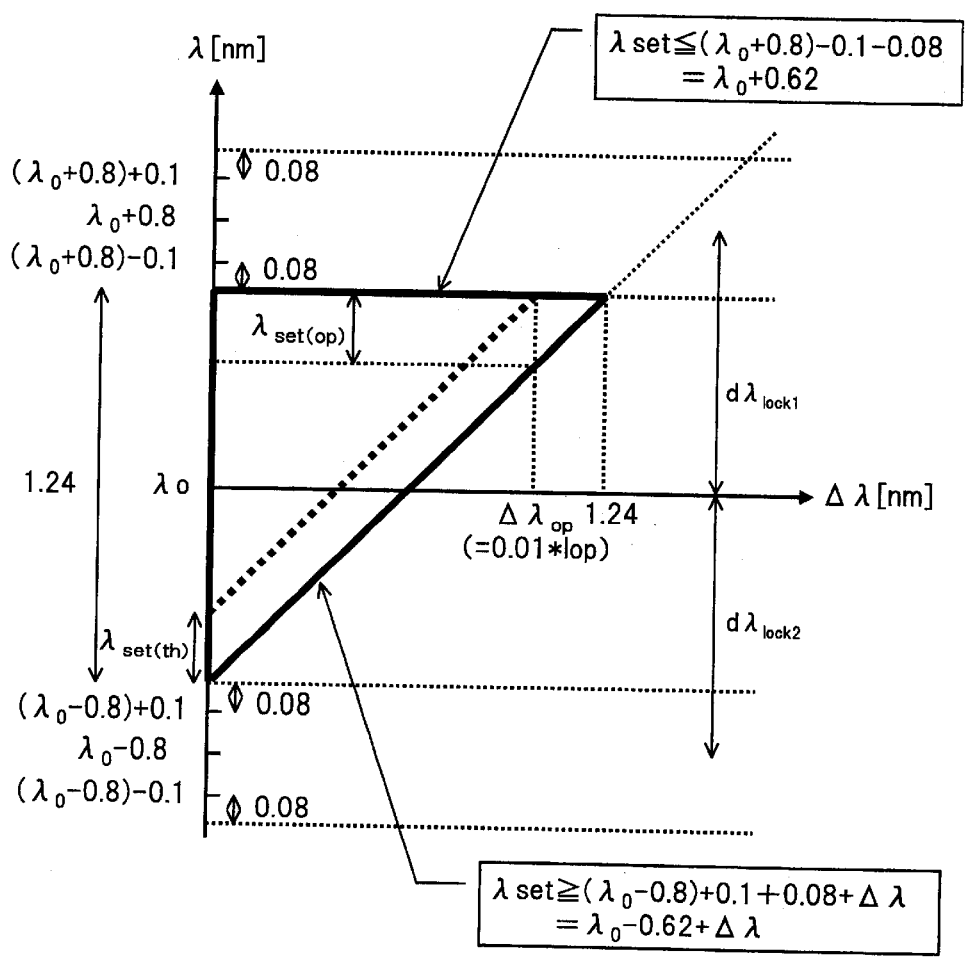
FIG. 9 is graph showing an allowable range $\lambda_{set}$ of optical output wavelengths in the first embodiment.

FIG. 9 shows the above described allowable range $\lambda_{set}$ similarly to FIG. 5.

In FIG. 9, considering a specific case in which the drive current Iop (mA) is supplied to the LD 1 in order to obtain a required optical output power, when the ratio of change in the optical output wavelength to the drive current is, for example 0.01 nm/mA, the wavelength variation amount $\Delta\lambda_{op}$ is 0.01×Iop. The allowable range of the optical output wavelength at this time is a range of $\lambda_{set\ (op)}$ as shown in the figure. Furthermore, in this case, the allowable range of the optical output wavelength of when the LD 1 starts laser emission (drive current is Ith) is a range shown by $\lambda_{set\ (th)}$ in the figure.

Here, $d\lambda_{lock1}$, and $d\lambda_{lock2}$ indicate wavelength leading ranges by the AFC circuit 30 are led, $d\lambda_{lock1}$ indicating the wavelength leading range on the long wavelength side, and $d\lambda_{lock2}$ indicating the wavelength leading range on the short wavelength side. In the figure, $d\lambda_{lock1} = d\lambda_{lock2} = 0.8$ nm is shown as one example.

As follows is a description of a specific control method for operating the present optical transmission apparatus with consideration of the allowable range $\lambda_{set}$ of the optical output wavelength as described above.

Firstly, a case is considered in which the optical transmission apparatus is started to generate an optical output of wavelength $\lambda_0$.

Figure 10:
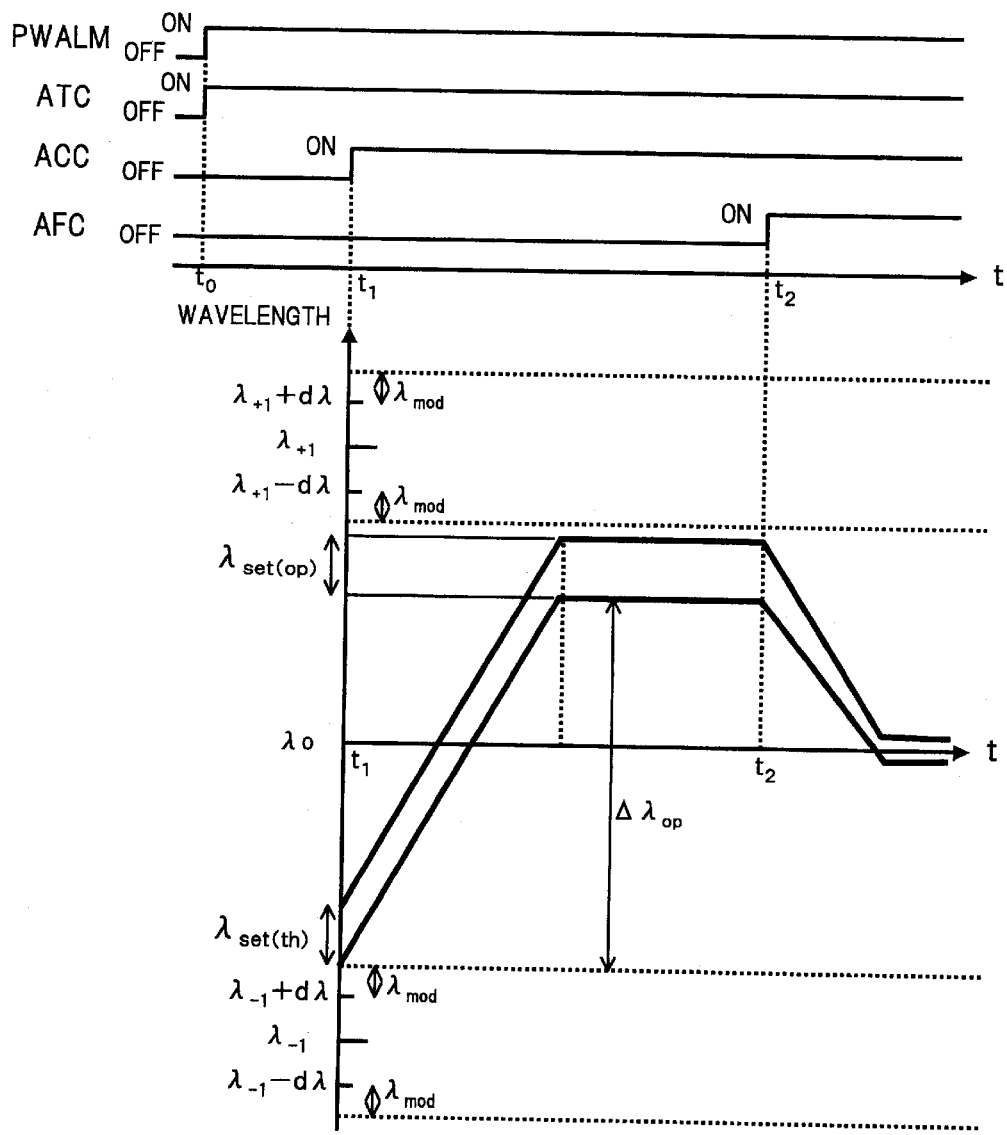
FIG. 10 is a diagram for explaining control operations at starting in the first embodiment.

FIG. 10 shows control timing (upper part) of each section at the starting, and a change with time (lower part) of the corresponding optical output wavelength.

As shown in FIG. 10, when the PWALM signal is switched ON (time $t_0$) as a trigger for starting the present apparatus to start emission, the timer 61 that has received the PWALM signal outputs a control signal to turn the switch 43 ON. As a result, the current from the Peltier drive section 42 is supplied to the Peltier element 41 via the switch 43, the control operation of the ATC circuit 40 is started (ATC ON), and the temperature of the LD 1 is automatically controlled so as to reach a required temperature set by a reference resistance value of the variable resistor 45. The temperature setting at this time is determined in advance such that the wavelength of when the drive current is supplied to the LD 1, and emission is started, is within the aforementioned allowable range $\lambda_{set\ (th)}$.

Then, when a sufficient time ($t_1$) for the temperature of the LD 1 to stabilize to the required value has passed, the timer 61 outputs a control signal to turn the switch 54 ON. As a result, the control operation of the ACC circuit 50 is started (ACC ON), and the supply of drive current to the LD 1 is started. By applying threshold current $I_{th}$ to the LD 1, laser emission is started, and the optical wavelength at this time is controlled within the allowable range $\lambda_{set\ (th)}$. Then, the optical output wavelength shifts to the long wavelength side with the increase of the drive current, and when the drive current reaches Iop, the drive current Iop is controlled to be constant by the ACC circuit 50, at which time the optical wavelength is within the allowable range $\lambda_{set\ (op)}$.

When a sufficient time ($t_2$) for the drive current to stabilize at Iop has passed, the timer 61 outputs a control signal to turn the switch 35 ON. As a result, the control operation of the AFC circuit 30 is started (AFC ON), and a control for leading the optical output wavelength to the target wavelength $\lambda_0$ is started. Specifically, the control operation of the AFC circuit 30 is to control the temperature of the LD 1 such that the optical output wavelength that has shifted to the long wavelength side thus approaches the target wavelength $\lambda_0$, by applying the output voltage of the op-amp 34 to the contact point "a" between the variable resistor 45 and the thermistor 46 via the switch 35 and the resistor 36. In this case, the temperature of the LD 1 is controlled by the AFC circuit 30 and the ATC circuit 40. However, with the relation of the time constant and the like of each control circuit, the temperature control by the AFC circuit 30 mainly performed. As a result, the optical output wavelength of the LD 1 is controlled to be constant in the vicinity of the target wavelength $\lambda_0$, the output light is sent to the modulation section 2 and, after being modulated, is output to the exterior.

Next, a case is considered where the optical output from the optical transmission apparatus is stopped.

Figure 11:
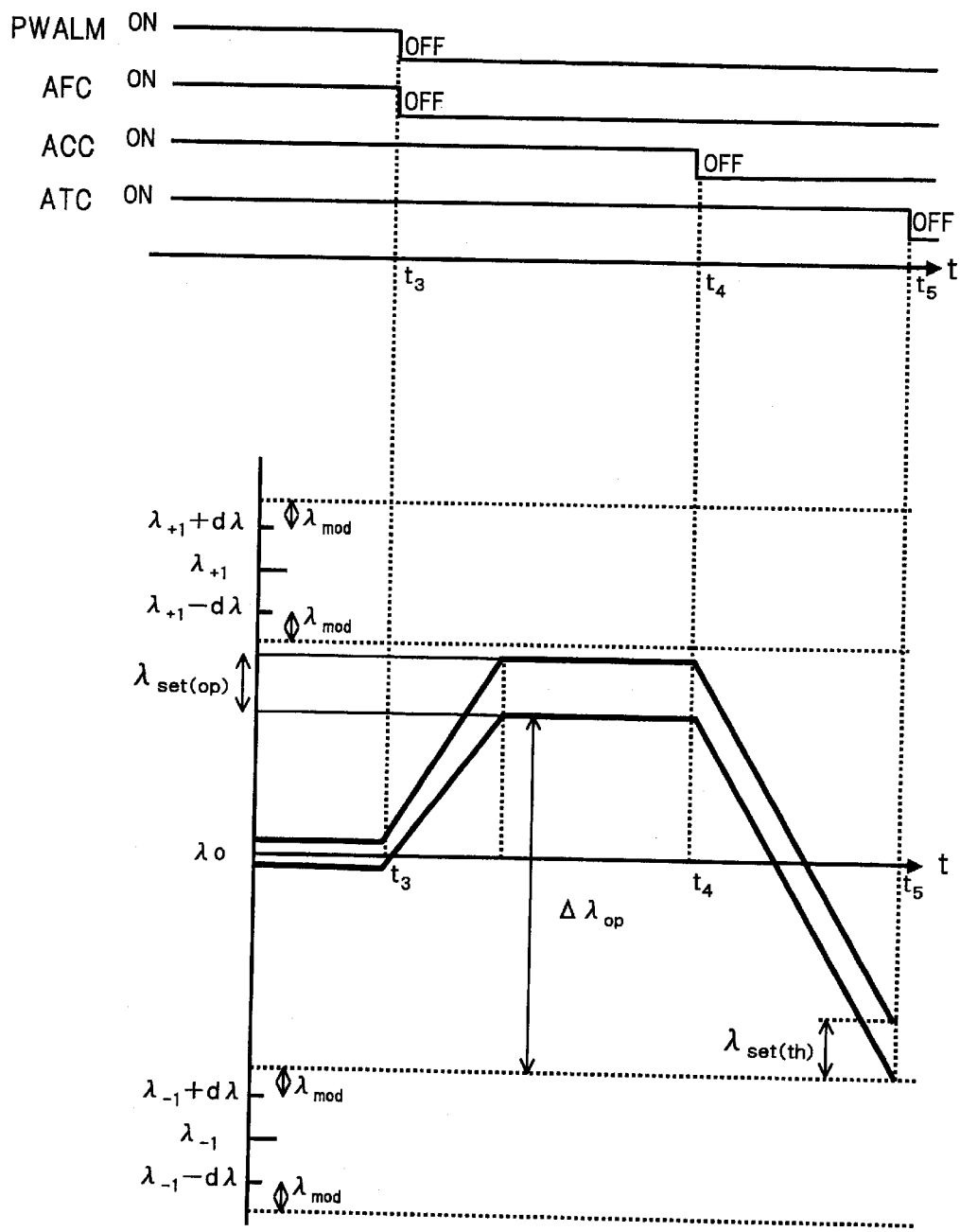
FIG. 11 is a diagram for explaining control operations during stopping in the first embodiment.

FIG. 11 shows the control timing (upper part) of each section during stopping, and the change with time (lower part) of the corresponding optical output wavelength.

As shown in FIG. 11, when the PWALM signal is turned OFF (time $t_3$) as a trigger to stop the optical output, the timer 61 that has received the PWALM signal outputs a control signal to turn the switch 35 OFF. As a result, the control operation of the AFC circuit 30 is stopped (AFC OFF), the temperature of the LD 1 is controlled by the ATC circuit 40, and the optical output wavelength shifts into the allowable range $\lambda_{set\ (op)}$ corresponding to the drive current Iop.

Then, when a sufficient time ($t_4$) for the optical output wavelength of the LD 1 to shift to the long wavelength side and then to stabilize has passed, the timer 61 outputs a control signal to turn the switch 54 OFF. As a result, the control operation of the ACC circuit 50 is suspended (ACC OFF), and the drive current supplied to the LD 1 starts decreasing. The optical output wavelength shifts to the short wavelength side with the decrease of the drive current, and when the drive current becomes less than the threshold current Ith, laser emission is stopped. Since the temperature control by the ATC circuit 40 is maintained, the optical output wavelength immediately before the emission stop becomes within the allowable range $\lambda_{set\ (th)}$.

In this manner, according to the WDM optical transmission apparatus of the first embodiment, the allowable range $\lambda_{set}$ of the optical output wavelength is set corresponding to the wavelength shift characteristics with respect to the drive current of the LD 1, and the ON/OFF states of the AFC circuit 30, the ATC circuit 40 and the ACC circuit 50 at starting and during stopping are switched at predetermined timing. Hence, an occurrence of inter-channel crosstalk can be avoided without installing optical filters, optical switches or the like as in the conventional technique. As a result, it becomes possible to achieve miniaturization and low cost of the WDM optical transmission apparatus. Furthermore, since there is no loss through optical filters, optical switches or the like, it becomes possible to achieve high output of the optical transmission apparatus.

Next is a description of a second embodiment of the present invention.

Figure 12:
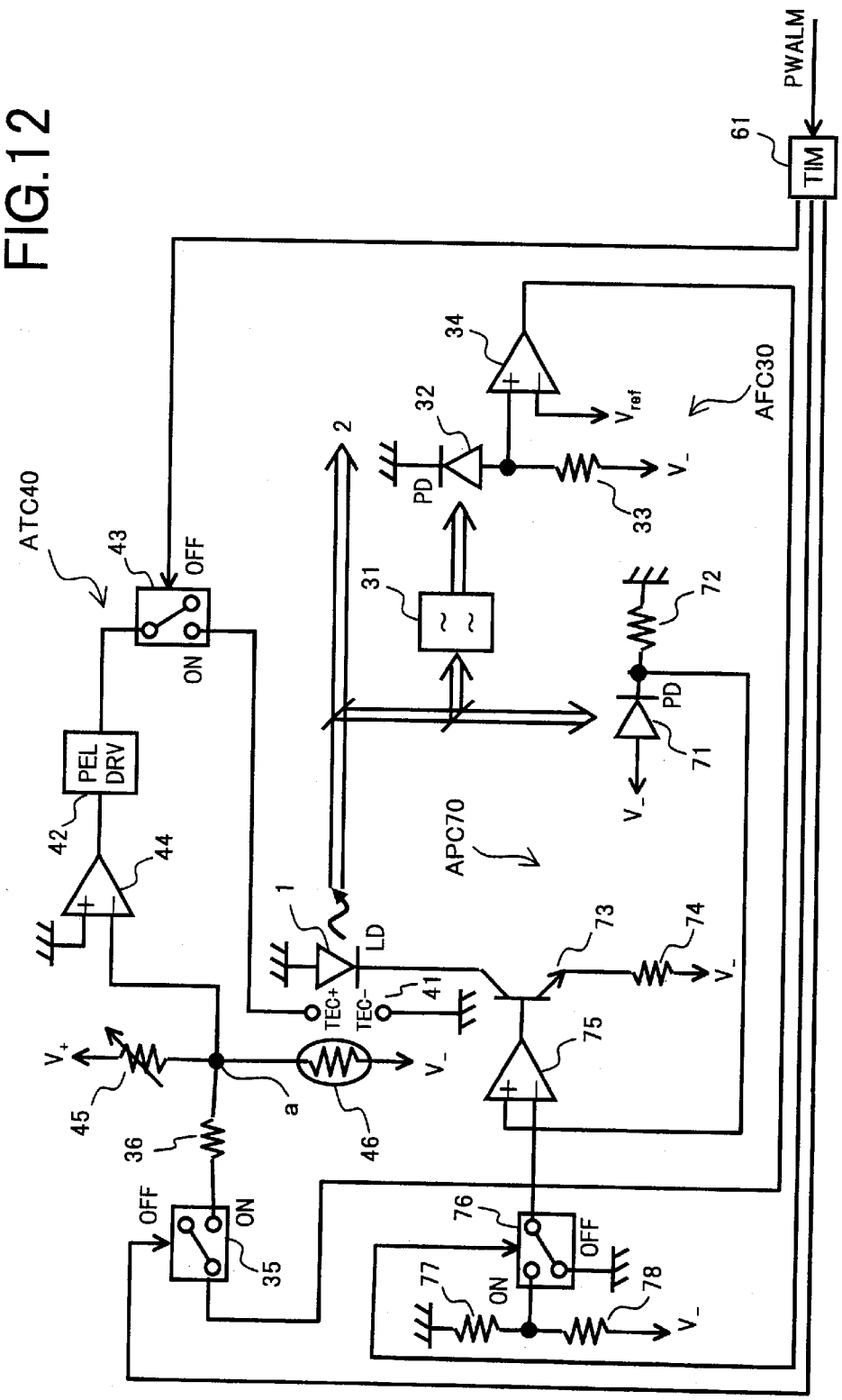
FIG. 12 is a diagram showing a structure of a WDM optical transmission apparatus of a second embodiment.

FIG. 12 shows a structural example of the second embodiment of the WDM optical transmission apparatus according to the present invention. Here, the same symbols are used for parts the same as in the structure of the first embodiment, and this is the same hereunder.

In FIG. 12, a difference in the structure of the present apparatus from the structure of the first embodiment is that for the drive current control section 5, the ACC circuit 50 for controlling the drive current to be constant has been used in the first embodiment, whereas an APC circuit 70 for realizing the automatic power control (APC) to control the drive current such that the optical output power is constant is used in the second embodiment. Structures other than the above are the same as in the first embodiment, and hence description thereof is omitted.

The APC circuit 70 has a photodiode (PD) 71, resistors 72, 74, 77 and 78, a transistor 73, an op-amp 75 and a switch 76. The PD 71 directly receives a part of the light output from the LD 1 and branched for the AFC circuit 30, to generate current corresponding to the received optical power. The resistor 72 converts the current generated by the PD 71 into a voltage. The transistor 73 has a collector terminal connected to the LD 1, an emitter terminal connected to the negative power source $V_-$ via the resistor 74, and a base terminal connected to an output terminal of the op-amp 75. The op-amp 75 has an inverting input terminal connected to a common contact point between the resistors 77 and 78 via the switch 76, and a non-inverting input terminal connected to a common contact point between the PD 71 and the resistor 72. The resistors 77 and 78 are connected in series between a ground terminal and the negative power source $V_-$, and a divided voltage at their common contact point is applied to the inverting input terminal of the op-amp 75 when the switch 76 is ON.

The operation of the optical transmission apparatus incorporating the abovementioned APC circuit 70, for the setting of the allowable range $\lambda_{set}$ of the optical output wavelength and the operation timing of each control circuit, is basically the same as the operation in the case of the first embodiment. The only difference from the case of the first embodiment is that the drive current supplied to the LD 1 is not controlled to be constant by the current value Iop of the ACC circuit 50, but the optical output power from the LD 1 is controlled to be at a required constant value by the APC circuit 70. The control operation of the APC circuit 70 is the same as the automatic power control that is typically used in well-known optical transmission apparatus, which detects the optical power output from the LD 1 and automatically controls the drive current of the LD 1 such that the optical power is at a constant level corresponding to a predetermined reference voltage which is set according to the values of the resistors 77 and 78.

In this manner, in the WDM optical transmission apparatus of the second embodiment, even if the drive current control method is replaced from ACC to APC, the same effect as in the first embodiment can be obtained.

Figure 13:
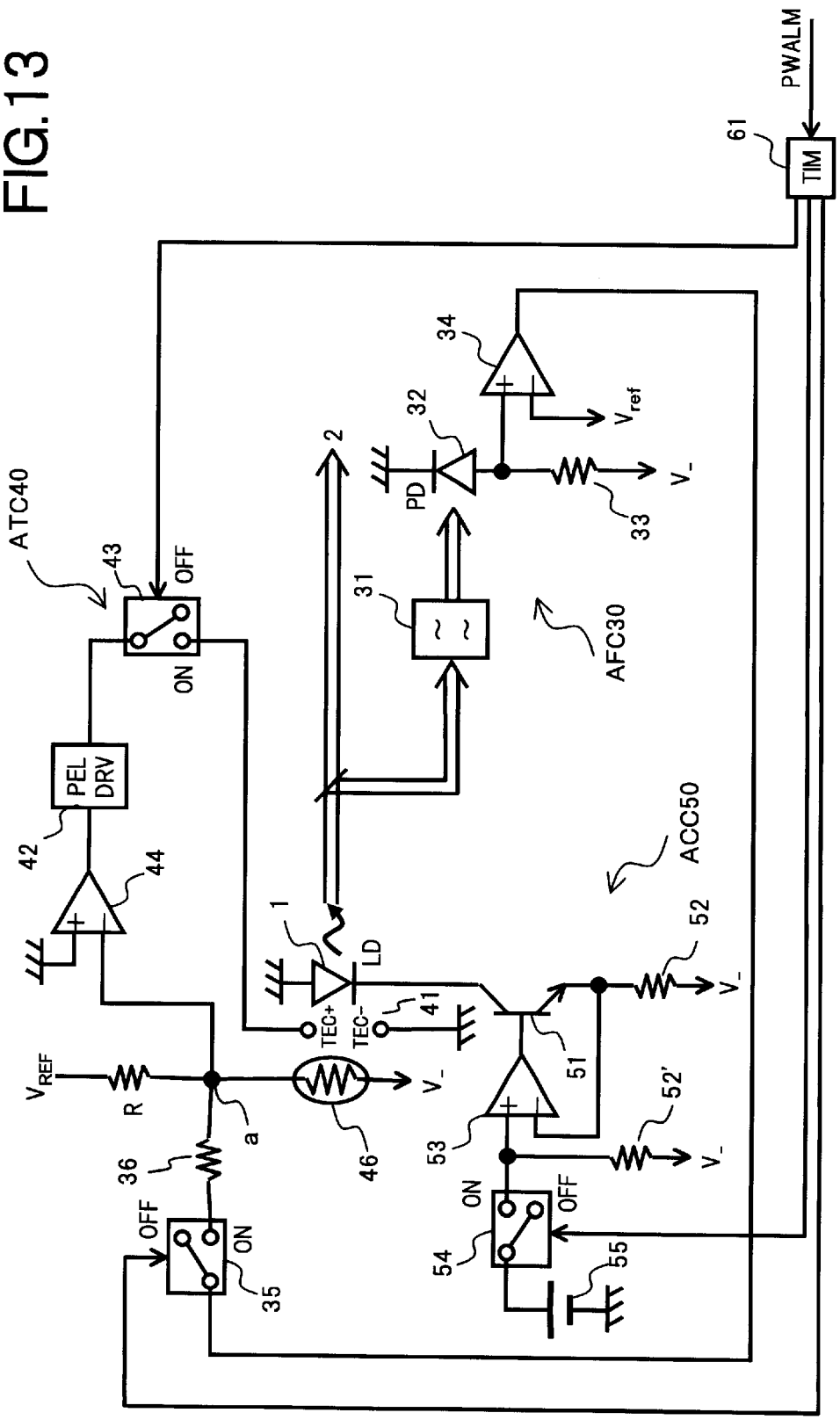
FIG. 13 is a diagram showing a structural example corresponding to the first embodiment when an ATC reference value is applied from the exterior.
Figure 14:
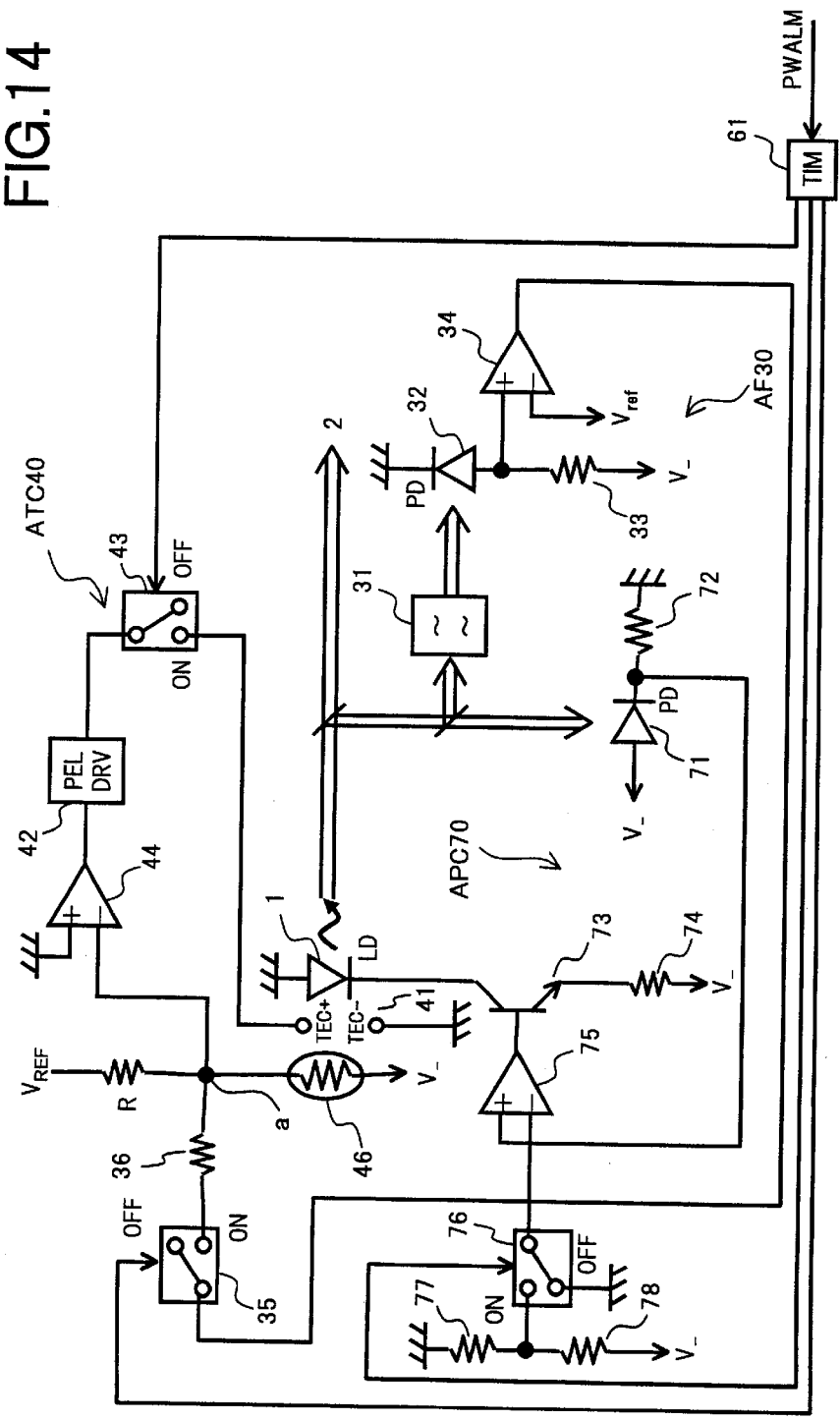
FIG. 14 is a diagram showing a structural example corresponding to the second embodiment when an ATC reference value is applied from the exterior.

Here, in the abovementioned first and second embodiments, the construction is such that the reference value of the temperature control in the ATC circuit 40 is set by the value of the variable resistor 45. However, the present invention is not limited to this. The construction may be such that instead of installing the variable resistor 45, a reference voltage $V_{REF}$ given from the exterior is applied to the contact point "a" via a resistor R. In this case, a structural example corresponding to the first embodiment is shown in FIG. 13, and a structural example corresponding to the second embodiment is shown in FIG. 14.

Next is a description of a third embodiment of the present invention.

Figure 15:
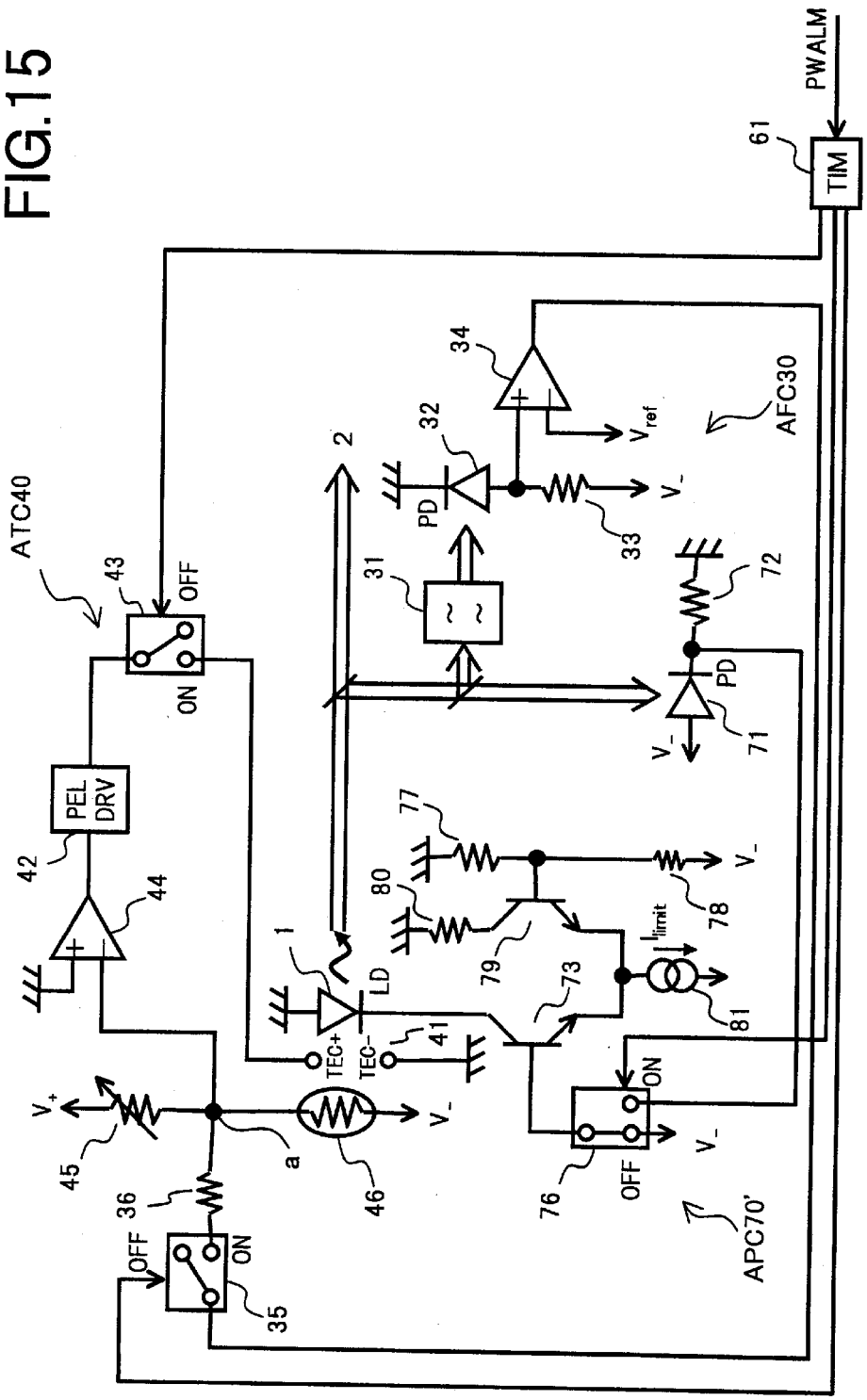
FIG. 15 is a diagram showing a structure of a WDM optical transmission apparatus of a third embodiment.

FIG. 15 shows a structural example of the third embodiment of the WDM optical transmission apparatus according to the present invention.

In FIG. 15, the present apparatus adopts an APC circuit 70' constructing a differential amplification circuit using a pair of transistors or the like, instead of the APC circuit 70 constructed using the op-amp 75 and the like, for the structure of the second embodiment.

To be specific, the APC circuit 70' has a PD 71, resistors 72, 77, 78 and 80, transistors 73 and 79, a switch 76 and a current source 81. The PD 71 receives a part of the light output from the LD 1 directly, and generates current depending on the received optical power. The resistor 72 converts the current generated by the PD 71 into a voltage. The transistor 73 has a collector terminal connected to the LD 1, an emitter terminal connected to the current source 81, and a base terminal is connected to a common contact point of the PD 71 and the resistor 72 via the switch 76. The transistor 79 has a collector terminal that is grounded via the transistor 80, and an emitter terminal connected to the current source 81. The resistors 77 and 78 are connected in series between the ground terminal and the negative power source $V_-$. The base terminal of the transistor 79 is connected to a contact point between the resistors 77 and 78. The switch 76 is turned ON and OFF according to a control signal from the timer 61. When it is ON, the APC loop is closed and the APC control is started. By the switching operation of this switch 76, the control operation of the APC circuit 70' is turned ON and OFF.

The optical transmission apparatus having the APC circuit 70' as described above basically operates similarly to the case of the second embodiment. The only difference is that the control operation of the APC is realized by a typical differential amplification circuit. By using a differential amplification type APC circuit 70', the upper threshold of drive current supplied to the LD 1 is limited by the maximum current value $I_{limit}$ of the current source 81, so that there is an advantage that excess current of the LD 1 can be prevented.

Next is a description of a fourth embodiment of the present invention.

Figure 16:
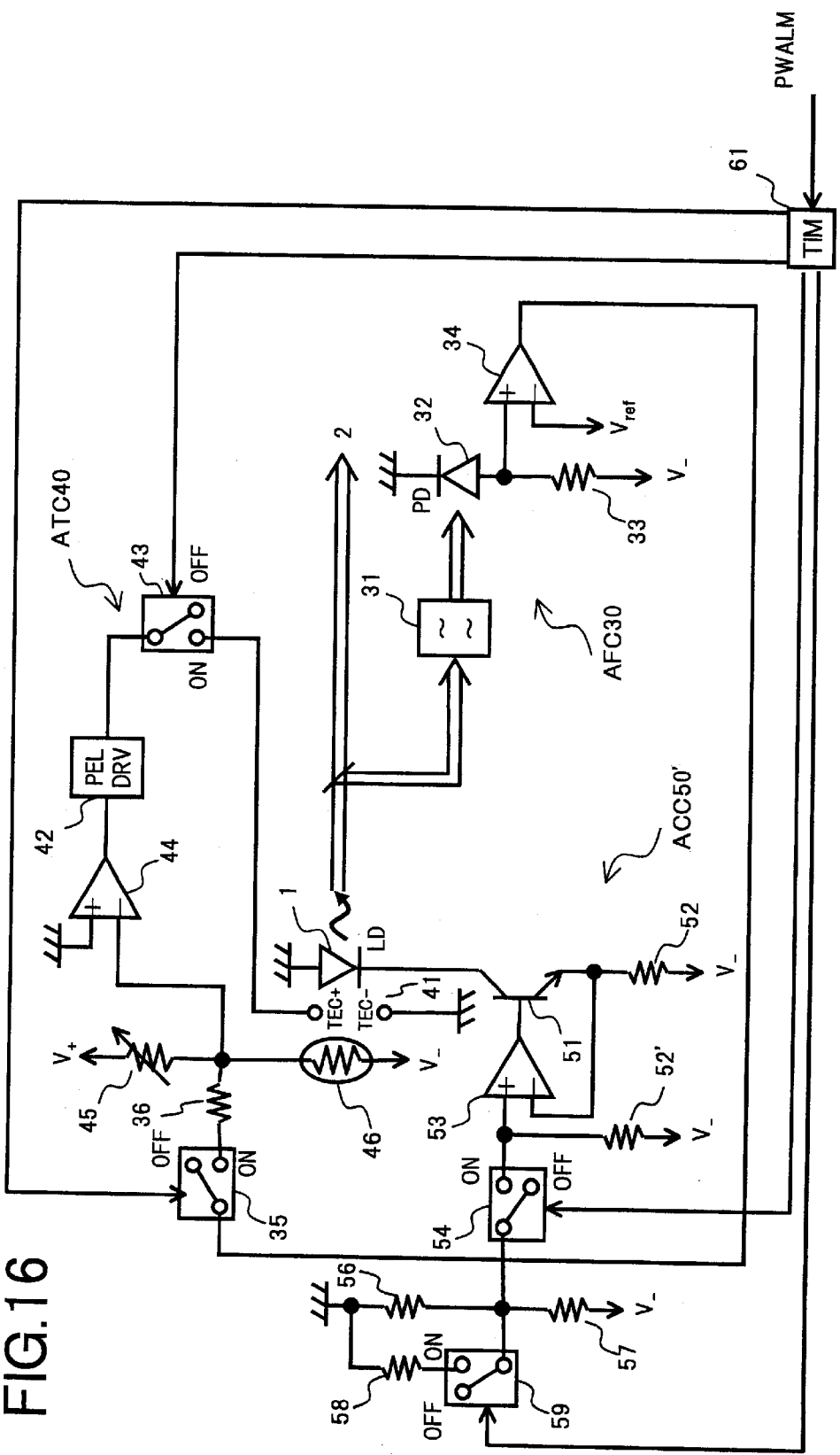
FIG. 16 is a diagram showing a structure of a WDM optical transmission apparatus of a fourth embodiment.

FIG. 16 shows a structural example of the fourth embodiment of the WDM optical transmission apparatus of the present invention.

In FIG. 16, the present apparatus adopts an ACC circuit 50', instead of the ACC circuit 50, for the construction of the first embodiment, and the reference voltage, being a reference for controlling the drive current to be constant, can be set in two stages, achieving an increase of the drive current and an increase of the maximum optical output power.

To be specific, the construction of the ACC circuit 50' is such that the power source 55 that applies a single reference voltage to the ACC circuit 50 used in the first embodiment is replaced by a circuit comprising resistors 56 through 58 and a switch 59. The resistors 56 and 57 are connected in series between the ground terminal and the negative power source $V_-$. Furthermore, the resistor 58 is connected in parallel to the resistor 56 via the switch 59. Here, a common contact point of the resistors 56 and 57, and the switch 59 is connected to the non-inverting input terminal of the op-amp 53 via the switch 54.

Figure 17:
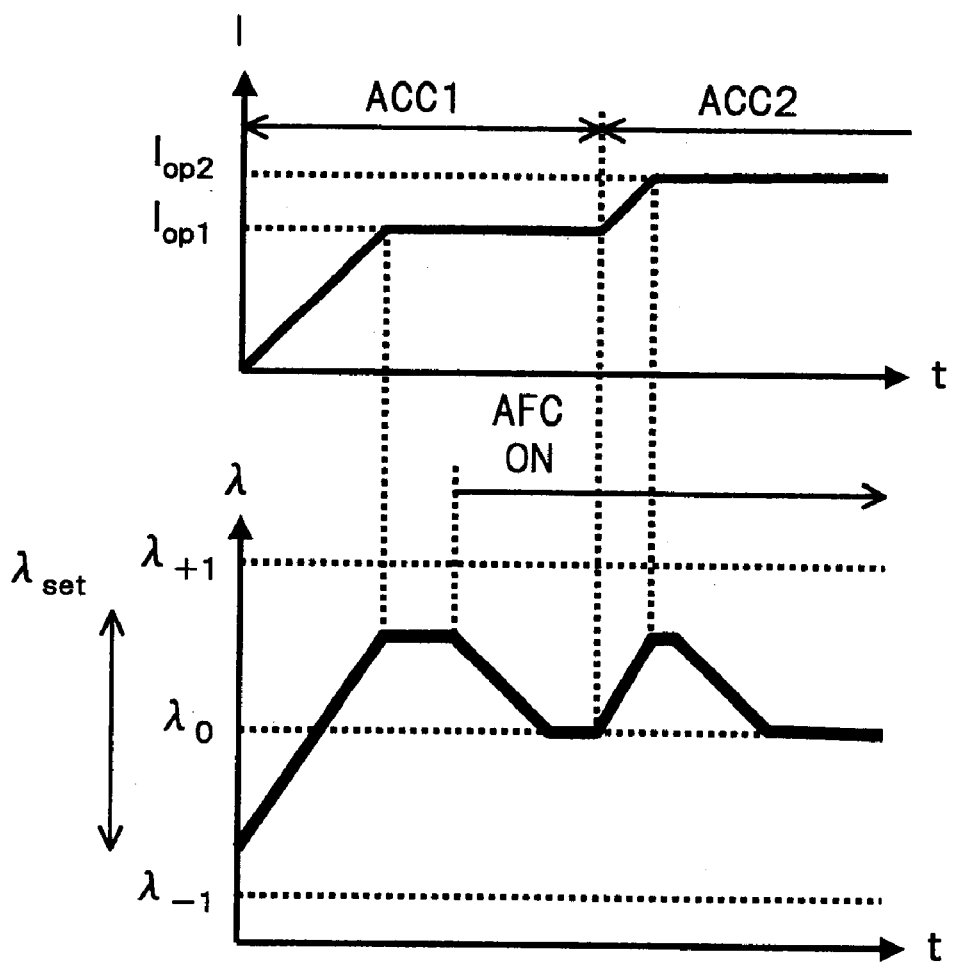
FIG. 17 is a diagram for explaining the control operation of an ACC circuit in the fourth embodiment.

FIG. 17 is a diagram to explain the control operation of the ACC circuit 50' of a construction as described above.

The control operation of the ACC circuit 50' is started when a control signal is sent from the timer 61 to turn the switch 54 ON. At this time, the switch 59 is OFF, and a divided voltage by the resistor 56 and the resistor 57 is applied as a first reference voltage to the op-amp 53 via the switch 54. Based on this first reference voltage, the drive current is controlled to be constant at a current value $I_{op1}$ as shown by ACC 1 at the upper part of FIG. 17. At this time, the optical output wavelength of the LD 1 shifts to the long wavelength side with the increase of the drive current as shown at the lower part of FIG. 17, and when the drive current reaches $I_{op1}$, the optical output wavelength is stabilized within the allowable range $\lambda_{set\ (op)}$. Then, similarly to the control flow of the first embodiment as mentioned above, the control operation of the AFC circuit 30 is started, and the optical output wavelength is led to the target wavelength $\lambda_0$.

When a sufficient time for the optical output wavelength to be stabilized at $\lambda_0$ has passed, a control signal to turn the switch 59 ON is output from the timer 61. As a result, a divided voltage by the resistors 56 and 58, and the resistor 57 is applied to the op-amp 53 as a second reference voltage. Based on this second reference voltage, the drive current is controlled to be constant at a current value $I_{op2}$ as shown by ACC 2 at the upper part of FIG. 17. At this time, the optical output wavelength of the LD 1 shifts to the long wavelength side with a further increase of the drive current, and when the drive current reaches $I_{op2}$, the optical output wavelength is led to the target wavelength $\lambda_0$ by the control operation of the AFC circuit 30.

In the fourth embodiment as described above, by using the ACC circuit 50' that can set the reference voltage in two stages, it is possible to increase the drive current to the LD 1 up to the current value $I_{op2}$ while maintaining the optical output wavelength within the allowable range $\lambda_{set}$. As a result, it becomes possible to increase the optical output power of LD, and hence a high output WDM optical transmission apparatus can be provided.

Here, in the above described fourth embodiment, the arrangement is such that the ACC reference voltage is set in two stages. However, the present invention is not limited to this. An application wherein the reference voltage is set in three or more stages is also possible.

Furthermore, for a method for realizing a control within the allowable range $\lambda_{set}$ of the optical output wavelength and also increasing the drive current of LD, in addition to the above described method, a method, for example, for switching the control state of ACC circuit based on an optical output wavelength detected by an AFC circuit is also effective.

Figure 18:
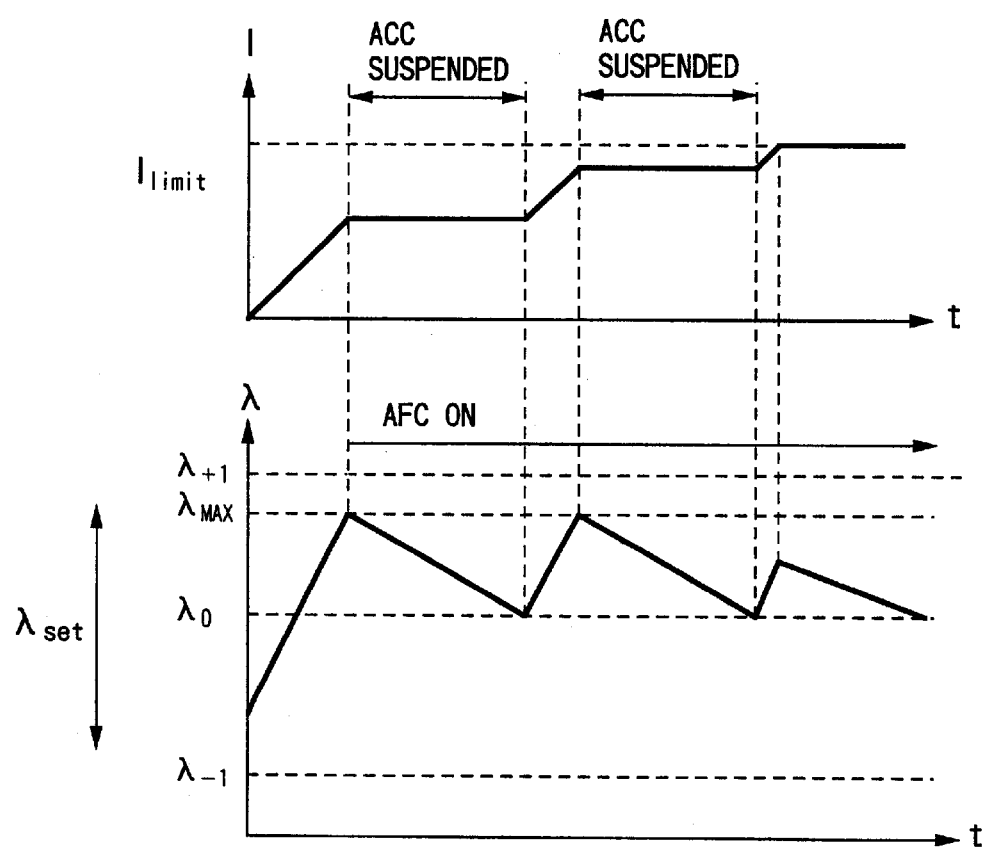
FIG. 18 is a diagram for explaining the operation of another specific example associated with the fourth embodiment.

To be specific, in the abovementioned structure shown in FIG. 8 for example, this method would be realized by adding a function for, based on the voltage level output from the op-amp 34 of the AFC circuit 30, detecting the optical output wavelength of the LD 1 to output an alarm, and a function for suspending the control operation of the ACC circuit 50 temporarily depending on the alarm, to maintain the drive current constant at that time, and then resuming the control operation. In this case, as shown at the lower part of FIG. 18, when the detected optical output wavelength of the LD 1 reaches the maximum wavelength $\lambda_{MAX}$ set in the vicinity of the upper limit of the allowable range $\lambda_{set}$ (alarm on), as shown at the upper part of FIG. 18, the control operation of the ACC circuit 50 is suspended temporarily and the drive current is then maintained constant. If the control operation of the AFC circuit 30 is already started at this time, the optical output wavelength is led to the target wavelength $\lambda_0$. When it is judged from a wavelength detection result of the AFC circuit 30 that the optical output wavelength has been led into the vicinity of $\lambda_0$ (alarm off), the suspended control operation of the ACC circuit 50 is resumed. As a result, the drive current of the LD is increased, and the optical output wavelength also shifts to the long wavelength side. Then, when the optical output wavelength reaches the maximum wavelength $\lambda_{MAX}$, the control operation of the ACC circuit 50 is suspended, and the same operation as above is repeated. Finally, the drive current reaches the target current value $I_{limit}$ of the ACC circuit 50 to become constant, with a result that the optical output wavelength is led to $\lambda_0$ by the control operation of the AFC circuit 30 to be stabilized.

By adopting such a method, even in a case where a high output is required, it becomes also possible to set the drive current of the LD appropriately while realizing the control within the allowable range $\lambda_{set}$ of optical output wavelength. Here, a case using an ACC circuit is described. However, a case using an APC circuit would be similar.

Next is a description of a fifth embodiment of the present invention.

The construction of the WDM optical transmission apparatus of the fifth embodiment is such that alarm signals indicating the control state of each of temperature and drive current are generated inside the apparatus, and each alarm signal is monitored by a sequencing section to control the operation timing of each section.

Figure 19:
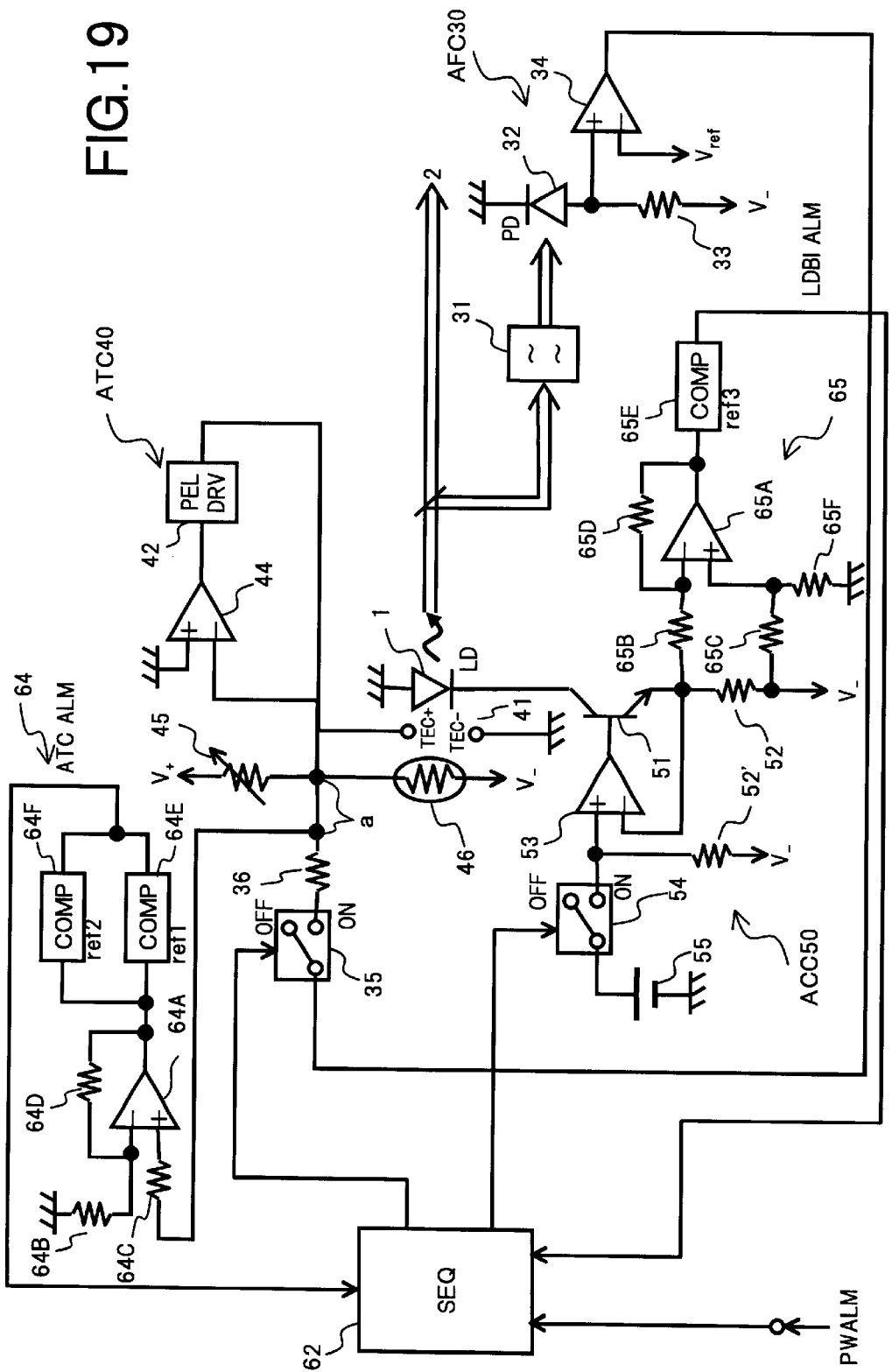
FIG. 19 is a diagram showing a structure of a WDM optical transmission apparatus of a fifth embodiment.

FIG. 19 shows a structural example of the WDM optical transmission apparatus of the fifth embodiment.

In FIG. 19, the present apparatus is characterized in that, for example, instead of the timer 61 used as the operation control section 6 in the construction of the first embodiment (refer to FIG. 8), a sequencing section (SEQ) 62, a temperature control alarm generation section 64 and a drive current control alarm generation section 65 are provided. Since the structure of each of the sections other than those above is the same as in the first embodiment, the description thereof is omitted.

The sequencing section 62 receives from the exterior an optical ON/OFF alarm (PWALM) signal instructing the ON/OFF of the optical output. It also receives a temperature control alarm (ATC ALM) signal generated in the temperature control alarm generation section 64 and a drive current control alarm (LDBI ALM) signal generated in the drive current control alarm generation section 65, and monitors the alarm signal levels to generate signals for switching the control states of the temperature and the drive current of the LD 1.

The temperature control alarm generation section 64 is provided with, for example, an op-amp 64A, resistors 64B, 64C and 64D, and comparators (COMP) 64E and 64F. The op-amp 64A has a non-inverting input terminal connected to the contact point "a" (the common contact point between the variable resistor 45 and the thermistor 46 in the ATC circuit 40) via the resistor 64C, and an inverting input terminal that is grounded via the resistor 64B, and furthermore, an output terminal thereof and the inverting input terminal are connected via the resistor 64D. The comparator 64E receives an output signal from the op-amp 64A to generate an ATC alarm signal when a level of the output signal becomes lower than a predetermined reference level ref1. The output signal from the op-amp 64A is also input to the comparator 64F, which generates an ATC alarm signal when the level of the output signal becomes higher than a predetermined reference level ref2 (>ref1). The ATC alarm signals output from the comparators 64E and 64F are input to the sequencing section 62. Here, the reference levels ref1 and ref2 are set in advance according to the reference value of temperature control in the ATC circuit 40.

The drive current control alarm generation section 65 has an op-amp 65A, resistors 65B, 65C, 65D and 65F, and a comparator (COMP) 65E. The op-amp 65A has a non-inverting input terminal that is grounded via the resistor 65F and is connected to one end (negative power source V_ side) of the resistor 52 of the ACC circuit 50, and an inverting input terminal connected to the other end (transistor 51 side) of the resistor 52 via the resistor 65B, and furthermore, an output terminal there of and the inverting input terminal are connected via the resistor 65D. The comparator 65E receives an output signal from the op-amp 65A to generate an LDBI alarm signal when a level of the output signal becomes lower than a predetermined reference level ref3. This LDBI alarm signal is sent to the sequencing section 62. Here, the reference level ref3 is set in advance according to the drive current Iop that is controlled to be constant by the ACC circuit 50 during normal operation.

Next is a description of an operation of the optical transmission apparatus of a construction as described above.

Figure 20:
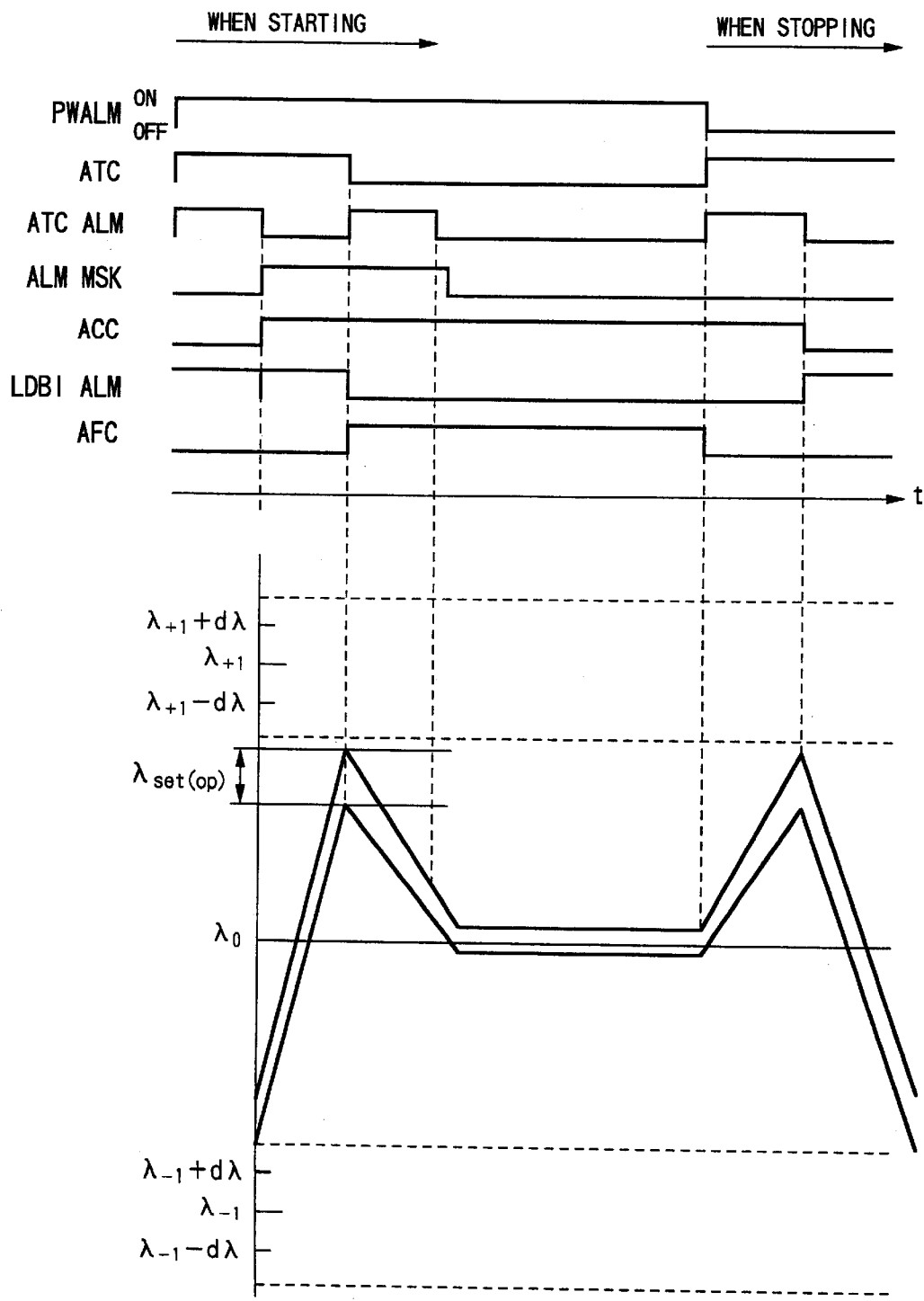
FIG. 20 is a diagram for explaining the operation of the fifth embodiment.
Figure 21:
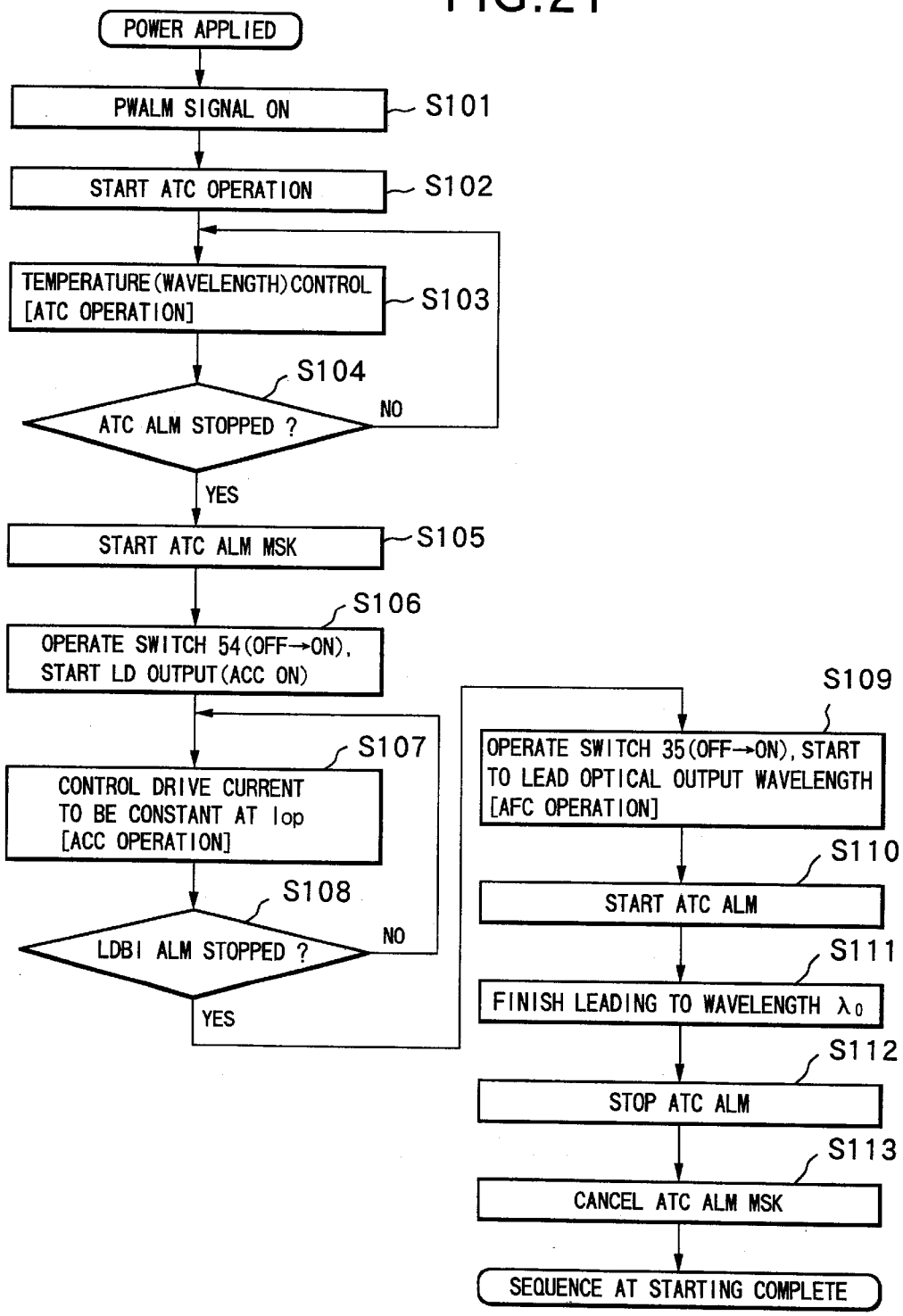
FIG. 21 is a flow chart showing a control operation of a sequencing section at starting.
Figure 22:
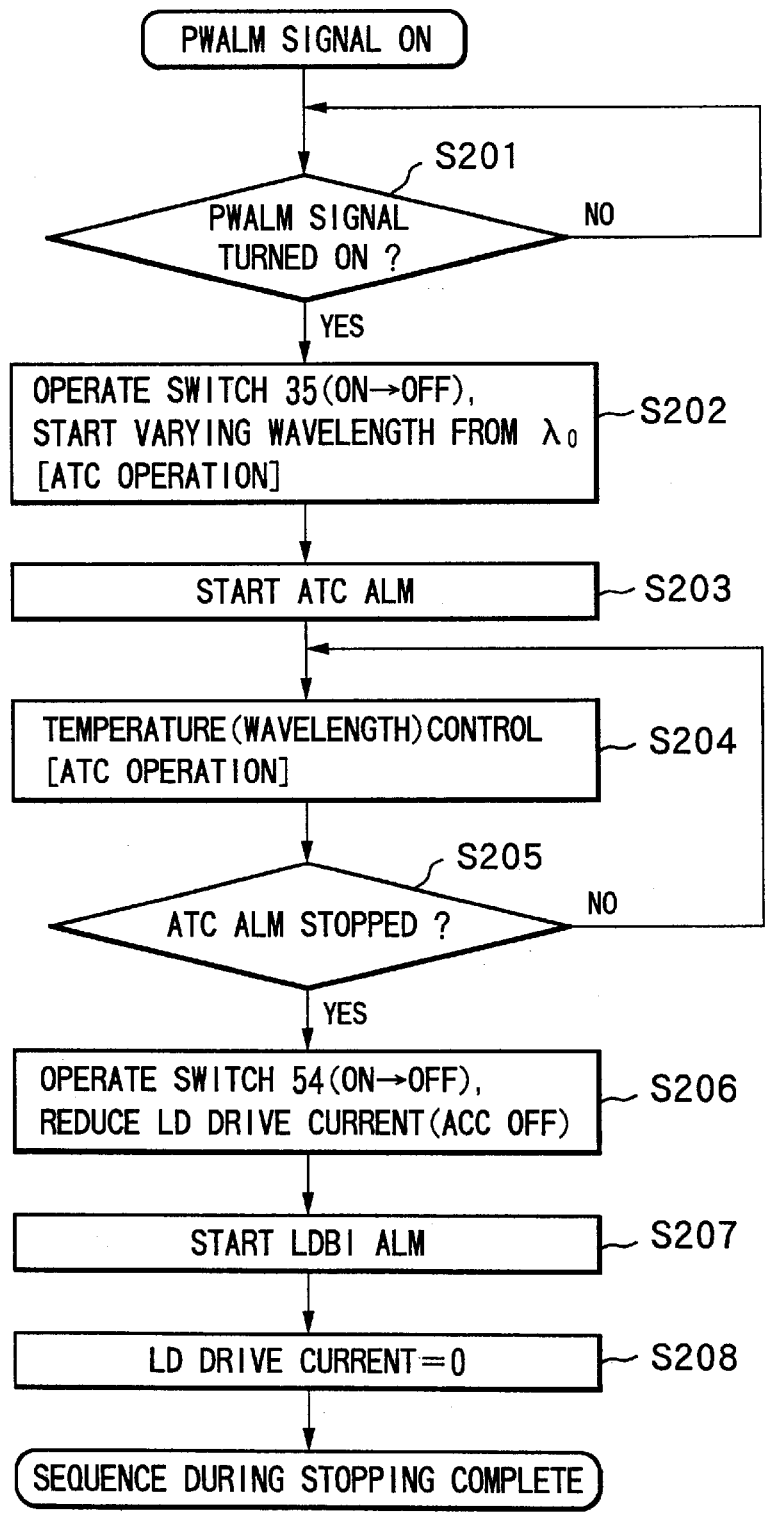
FIG. 22 is a flow chart showing the control operation of the sequencing section during stopping.

FIG. 20 shows control timing (upper part) of each section at starting and during stopping of the present apparatus, and the change with time (lower part) of the corresponding optical output wavelength. Furthermore, FIG. 21 is a flow chart showing the control operation of the sequencing section 62 at starting, and FIG. 22 is a flow chart showing the control operation of the sequencing section 62 during stopping. Here, the allowable range $\lambda_{set}$ of optical output wavelength is the same as the abovementioned range shown in FIG. 9.

Firstly, considering the operation at starting, in step 101 of FIG. 21 (designated as S101 in the figure and the same hereunder) for example, at the same time as the power source of the present apparatus is turned ON, the PWALM signal to be given from the exterior to the sequencing section 62 is turned ON to instruct the generation of optical output. When the power source is turned ON, in step 102, the control operation of the ATC circuit 40 is started. At this time, if the temperature of the LD 1 is deviated from the reference temperature in the ATC set depending on the variable resistor 45, the output level of the op-amp 64A based on the voltage level of the contact point "a" becomes lower than the reference level ref1 of the comparator 64E, or higher than the reference level ref2 of the comparator 64F, and the ATC alarm signal starts to be transmitted to the sequencing section 62. The sequencing section 62 monitors the start of the ATC alarm signal and waits until the temperature of the LD 1 is stabilized at the reference temperature and the ATC alarm signal is stopped (step 104) as a result of temperature control by the ATC circuit 40 (step 103).

When the ATC alarm signal is stopped, in step 105, ATC alarm mask (ATC ALM MSK) processing inside the sequencing section 62 is started, and at the same time in step 106, a signal is output from the sequencing section 62 to turn the switch 54 of the ACC circuit 50 from OFF to ON, and the supply of drive current to the LD 1 is then started. The ATC alarm mask processing is a process for masking ATC alarm signals inside the sequencing section 62 until a fixed period passes. The fixed period in which this mask processing is performed is set in advance corresponding to the period in which the optical output wavelength is stabilized in the vicinity of the target wavelength $\lambda_0$ by the control operation of the AFC circuit 30 to be started later.

When the control operation of the ACC circuit 50 is started in step 106, the optical output wavelength shifts to the long wavelength side with the increase of the drive current (refer to the lower part of FIG. 20). At this time, during the period until the drive current is controlled to be constant at the current value lop, the output level of the op-amp 65A becomes lower than the reference level ref3 of the comparator 65E, and the LDBI alarm signal starts to be transmitted to the sequencing section 62. The sequencing section 62 monitors the start of the LDBI alarm signal and waits until the drive current reaches the current value lop and the LDBI alarm signal is stopped (step 108) as a result of the drive current being controlled to be constant by the ACC circuit (step 107).

When the LDBI alarm signal is stopped, in step 109, a signal to turn the switch 35 of the AFC circuit 30 from OFF to ON is output from the sequencing section 62, and the control is started to lead the optical output wavelength to the target wavelength $\lambda_0$ by the AFC circuit 30. At this time, the switch 35 is turned ON with a result that the voltage level at the contact point "a" is changed, and the ATC alarm signal is started (step 110). However, since the start of this ATC alarm signal is ignored due to the ATC alarm mask processing, it does not influence the control operation of the sequencing section 62. Then, in step 111, the temperature of the LD 1 is controlled by the control operation of the AFC circuit 30, and when the optical output wavelength is led into the vicinity of the target wavelength $\lambda_0$, the ATC alarm signal turns to be stopped in step 112. Afterwards, when the leading of the optical output wavelength to the target wavelength $\lambda_0$ is finished, in step 113, the ATC alarm mask processing inside the sequencing section 62 is cancelled, thus completing the control operation of the present apparatus at starting.

Next, considering a case of stopping the optical output of the present apparatus, as shown in step 201 in FIG. 22, the sequencing section 62 monitors whether the PWALM signal is turned from ON to OFF. If the PWALM signal is OFF, in step 202, a signal is output from the sequencing section 62 to turn the switch 35 of the AFC circuit 30 from ON to OFF, and the control operation of the AFC circuit 30 is stopped. As a result, the optical output wavelength starts to shift from the target wavelength $\lambda_0$ to the long wavelength side. Here, since the control operation of the ATC circuit 40 is maintained at this time, the temperature of the LD 1 is controlled at the reference temperature of the ATC. Since the voltage level at the contact point "a" is changed by the shift of the optical output. wavelength, the ATC alarm signal starts to be transmitted to the sequencing section 62 in step 203. The sequencing section 62 monitors the start of the ATC alarm signal and waits until the temperature of the LD 1 is stabilized at the reference temperature and the ATC alarm signal is stopped (step 205) as a result of temperature control (step 204) by the ATC circuit 40.

When the ATC alarm signal is stopped, in step 206, a signal is output from the sequencing section 62 to turn the switch 54 of the ACC circuit 50 from ON to OFF, and the drive current supplied to the LD 1 starts to be decreased. As a result, in step 207, the LDBI alarm signal turns to be started, and the optical output wavelength shifts to the short wavelength side with the decrease of the drive current. Then, the drive current reaches zero and the optical output extinguishes, thus completing the control operation of the present apparatus during stopping.

In this manner, in the fifth embodiment, by using the operation control section 6 having the construction wherein alarm signals indicating the control states of the temperature and drive current are generated inside the apparatus and monitored by the sequencing section 62, the same effect as in the case of the abovementioned first embodiment can be obtained. Furthermore, since the operation timing of each section is controlled depending on the actual control states based on the alarm signals generated inside the apparatus, it is possible to control the operation timing more accurately than in the case where the timer 61 is used.

Here, in the fifth embodiment, a case is described wherein the timer in the first embodiment is replaced with a sequencing section or the like. However, similar modifications are possible to the second through fourth embodiments.

INDUSTRIAL APPLICABILITY

The present invention has considerable industrial applicability in optical transmission apparatus used for a variety of optical transmitting systems applied with wavelength multiplexing techniques.

What is claimed is:

1. A WDM optical transmission apparatus used in a WDM optical transmission system for transmitting a wavelength division multiplexed optical signal including a plurality of different optical signals, comprising:

a light source for generating light whose wavelength is changed according to the temperature and a drive current;

temperature control means for controlling the temperature of said light source so that a wavelength at the starting of emission of said light source is stabilized in an allowable range of optical output wavelength set in advance, based on wavelength characteristics for said light source drive current and intervals between adjacent optical signal wavelengths;

drive current control means for controlling the drive current applied to said light source according to the allowable range of the optical output wavelength;

wavelength control means for detecting a wavelength of light output from said light source and controlling the temperature of said light source based on said detection result, to lead the optical output wavelength into the vicinity of a preset target wavelength; and operation control means for controlling the start and stop of respective control operations of said temperature control means, said drive current control means and said wavelength control means at predetermined timing respectively corresponding to the time of optical output generation and the time of optical output stop.

2. A WDM optical transmission apparatus according to claim 1, wherein an allowable range $\lambda_{set}$ of said optical output wavelength is a range that satisfies each of the following conditional equations:

$$\lambda_{set} \geq \lambda_{-1} d\lambda + \lambda_{mod} + \Delta\lambda;$$

and $$\lambda_{set} \leq \lambda_{+1} - d\lambda - \lambda_{mod}$$

where a target wavelength of the optical output is $\lambda_0$, an adjacent optical signal wavelength on a short wavelength side is $\lambda_{-1}$, an adjacent optical signal wavelength on a long wavelength side is $\lambda_{+1}$, a setting error of each optical signal wavelength is $d\lambda$, a modulation bandwidth representing a wavelength variation amount caused by modulation of the output light is $\lambda_{mod}$, and a wavelength variation amount according to wavelength characteristics for the drive current of said light source is $\Delta\lambda$.

3. A WDM optical transmission apparatus according to claim 1, wherein said operation control means starts the control operation of said temperature control means when the optical output is generated, starts the control operation of said drive current control means when said temperature control is stabilized, starts the control operation of said wavelength control means when said drive current control is stabilized, and furthermore, said operation control means stops the control operation of said wavelength control means when the optical output is stopped, stops the control operation of said drive current control means when the temperature of said light source is stabilized by the control operation of said temperature control means, and stops the control operation of said temperature control means when there is no supply of drive current to said light source and emission is stopped.

4. A WDM optical transmission apparatus according to claim 1, wherein said drive current control means performs automatic current control for controlling the drive current supplied to the light source to be constant.

5. A WDM optical transmission apparatus according to claim 1, wherein said drive current control means performs an automatic power control for controlling the drive current such that the optical output power from said light source is constant.

6. A WDM optical transmission apparatus according to claim 5, wherein said drive current control means is provided with a circuit structure of a differential amplification type.

7. A WDM optical transmission apparatus according to claim 1, wherein a reference temperature being a target of the control operation of said temperature control means is given according to a reference voltage set inside the apparatus.

8. A WDM optical transmission apparatus according to claim 1, wherein a reference temperature being a target of the control operation of said temperature control means is set according to a reference voltage given from the exterior of the apparatus.

9. A WDM optical transmission apparatus according to claim 1, wherein said drive current control means is capable of setting in stepwise a reference value being a target of the control operation according to a plurality of reference voltages, and said operation control means starts the control operation of said temperature control means when the optical output is generated, starts the control operation of said drive current control means when said temperature control is stabilized, starts the control operation of said wavelength control means when said drive current control is stabilized, and when said wavelength control is stabilized, switches a reference voltage of said drive current control means to a higher level by one step each time, and continuously repeats the switching of the reference voltage each time the wavelength control is stabilized.

10. A WDM optical transmission apparatus according to claim 1, wherein said operation control means starts the control operation of said temperature control means when the optical output is generated, starts the control operation of said drive current control means when said temperature control is stabilized, and thereafter, during a period until the drive current reaches a target reference value, repeats a series of operations in which, when the optical output wavelength detected by said wavelength control means reaches an upper limit wavelength set within the allowable range, the control operation of said wavelength control means is started and also the control operation of said drive current control means is suspended, and when the optical output wavelength is led into the vicinity of the target wavelength by the control operation of said wavelength control means, the control operation of said drive current control means is resumed.

11. A WDM optical transmission apparatus according to claim 1, wherein said drive current control means is provided with a timer for performing timing operations in synchronization with an alarm signal input for instructing the generation and stop of optical output, and outputting a signal for controlling the start and stop of the respective control operation of said temperature control means, said drive current control means and said wavelength control means according to predetermined timing set in advance.

12. A WDM optical transmission apparatus according to claim 1, wherein said operation control means a temperature control alarm generation section for generating a temperature control alarm signal indicating the control state of said temperature control means, a drive current control alarm generation section for generating a drive current control alarm signal indicating the control state of said drive current control means, and a sequencing section for controlling the start and stop of the respective control operations of said temperature control means, said drive current control means and said wavelength control means based on external alarm signals for instructing the generation and stop of optical output, the temperature control alarm signal and the drive current control alarm signal.

13. A WDM optical transmission apparatus according to claim 12, wherein said temperature control alarm generation section starts to send said temperature control alarm signal when the temperature of said light source is not controlled within a predetermined range, said drive current control alarm generation section starts to send said drive current control alarm signal when the drive current to said light source has not reached a predetermined current value, said sequencing section starts the control operation of said temperature control means when the optical output is generated according to said external alarm signals for instructing the generation of optical output, starts the control operation of said drive current control means when said temperature control alarm signal is stopped, starts the control operation of said wavelength control means when said drive current control alarm signal is stopped, and furthermore, when the optical output is stopped, stops the control operation of said wavelength control means according to the external alarm signals for instructing the stop of the optical output, and when said temperature control alarm signal is stopped, stops the control operation of said drive current control means.

* * * * *